United States Patent [19]
Bozler et al.

[11] Patent Number: 6,127,908
[45] Date of Patent: Oct. 3, 2000

[54] MICROELECTRO-MECHANICAL SYSTEM ACTUATOR DEVICE AND RECONFIGURABLE CIRCUITS UTILIZING SAME

[75] Inventors: Carl O. Bozler, Waltham; Richard G. Drangmeister, Westford; Robert J. Parr, Arlington; Lawrence J. Kushner, Andover, all of Mass.

[73] Assignee: Massachusetts Institute of Technology, Cambridge, Mass.

[21] Appl. No.: 08/972,224

[22] Filed: Nov. 17, 1997

[51] Int. Cl.⁷ .............................. H01P 1/10; H01C 10/06; H01G 5/011; H03F 1/00
[52] U.S. Cl. ...................... 333/246; 333/202; 333/262; 333/263; 333/105; 336/10; 338/97; 338/202; 338/200; 330/66; 361/278; 361/281; 361/292; 361/287
[58] Field of Search .......................... 333/101, 33, 105, 333/202, 262, 263, 246; 336/10; 338/92, 96, 97, 200–202; 330/66; 361/277, 278, 281, 287, 292

[56] References Cited

U.S. PATENT DOCUMENTS

| | | | |
|---|---|---|---|
| 3,573,674 | 4/1971 | Wehner | 333/202 |
| 3,597,709 | 8/1971 | Rhodes | 333/203 |
| 3,736,536 | 5/1973 | Wenzel | 333/203 |
| 3,796,976 | 3/1974 | Heng et al. | 333/262 X |
| 4,119,932 | 10/1978 | Bockrath | 333/21 A |
| 4,598,252 | 7/1986 | Andricos | 330/51 |
| 4,910,396 | 3/1990 | Grove | 250/229 |
| 5,175,521 | 12/1992 | Larson | 333/235 |
| 5,233,459 | 8/1993 | Bozler et al. | 359/230 |
| 5,258,591 | 11/1993 | Buck | 333/262 X |

(List continued on next page.)

FOREIGN PATENT DOCUMENTS

| | | |
|---|---|---|
| 0 637 042 A2 | 2/1995 | European Pat. Off. . |
| 0 654 802 A1 | 5/1995 | European Pat. Off. . |
| 0 709 911 A2 | 5/1996 | European Pat. Off. . |
| 4421980 | 4/1995 | Germany . |
| 05235282 | 10/1993 | Japan . |
| WO 95/01624 | 1/1995 | WIPO . |

OTHER PUBLICATIONS

"Micromechanical Membrane Switches on Silicon", K.E. Peterson vol. 23, No. 4, Jul. 1979, pp. 376–385, IBM Journal of Research and Development.

*Primary Examiner*—Robert Pascal
*Assistant Examiner*—Barbara Summons
*Attorney, Agent, or Firm*—Samuels, Gauthier & Stevens, LLP

[57] ABSTRACT

A microelectro-mechanical device which includes a fixed electrode formed on a substrate, the fixed electrode including a transparent, high resistance layer, and a moveable electrode formed with an anisotropic stress in a predetermined direction and disposed adjacent the fixed electrode. The device includes first and second electrically conductive regions which are isolated from one another by the fixed electrode. The moveable electrode moves to cover the fixed electrode and to electrically couple to the second conductive region, thus electrically coupling the first and second conductive regions, in response to a potential being applied across the fixed and moveable electrodes. The fixed electrode is transparent to electromagnetic signals or waves and the moveable electrode impedes or allows transmission of electromagnetic signals or waves. In one embodiment of the invention, the fixed and moveable electrodes are configured within an array of similar devices, and each device or groups of devices in the array are individually addressable to actuate the moveable electrodes. In another embodiment of the invention, there is provided a reconfigurable circuit including an array of actuatable devices which are addressed individually or in selected groups, each of the actuatable devices having a fixed electrode formed on a substrate, the fixed electrode including a transparent, high resistance layer, and a moveable electrode formed with an anisotropic stress in a predetermined direction and disposed adjacent the fixed electrode.

23 Claims, 26 Drawing Sheets

U.S. PATENT DOCUMENTS

| | | | |
|---|---|---|---|
| 5,258,626 | 11/1993 | Suzuki et al. | 505/181 |
| 5,367,136 | 11/1994 | Buck | 333/262 X |
| 5,519,565 | 5/1996 | Kalt et al. | 361/280 |
| 5,541,614 | 7/1996 | Lam et al. | 343/701 X |
| 5,578,976 | 11/1996 | Yao | 333/262 |
| 5,619,061 | 4/1997 | Goldsmith et al. | 257/619 X |
| 5,808,527 | 9/1998 | De Los Santos | 333/205 |

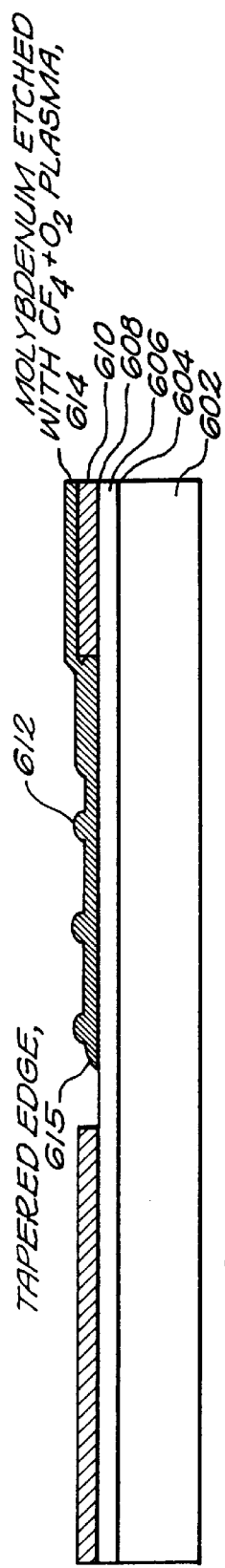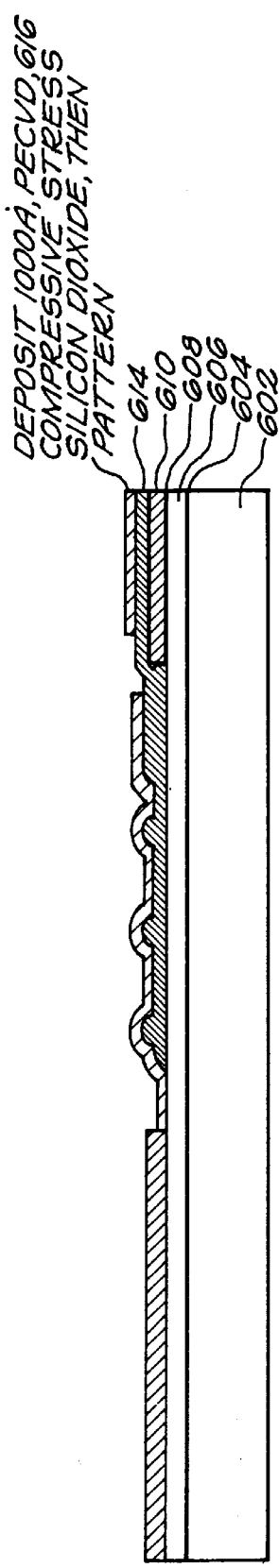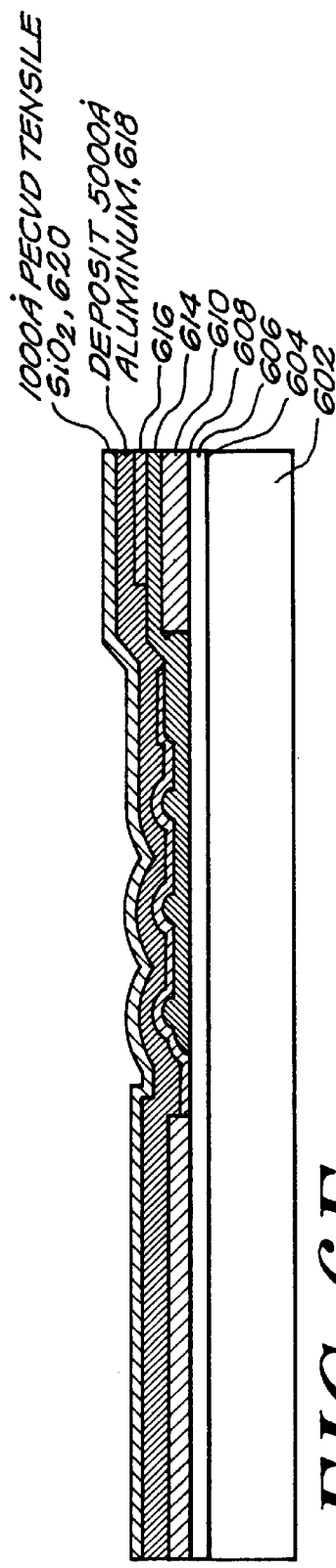

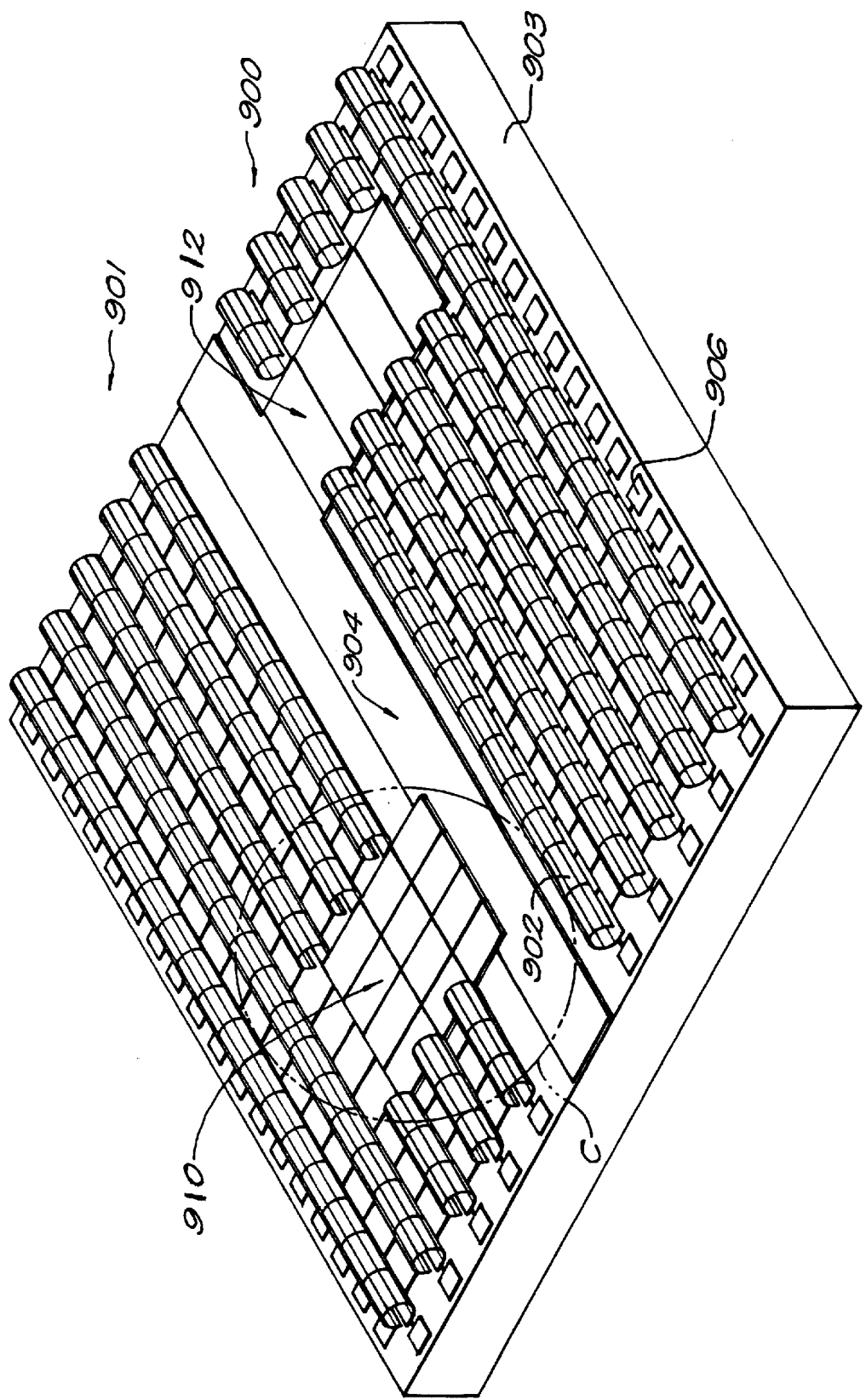

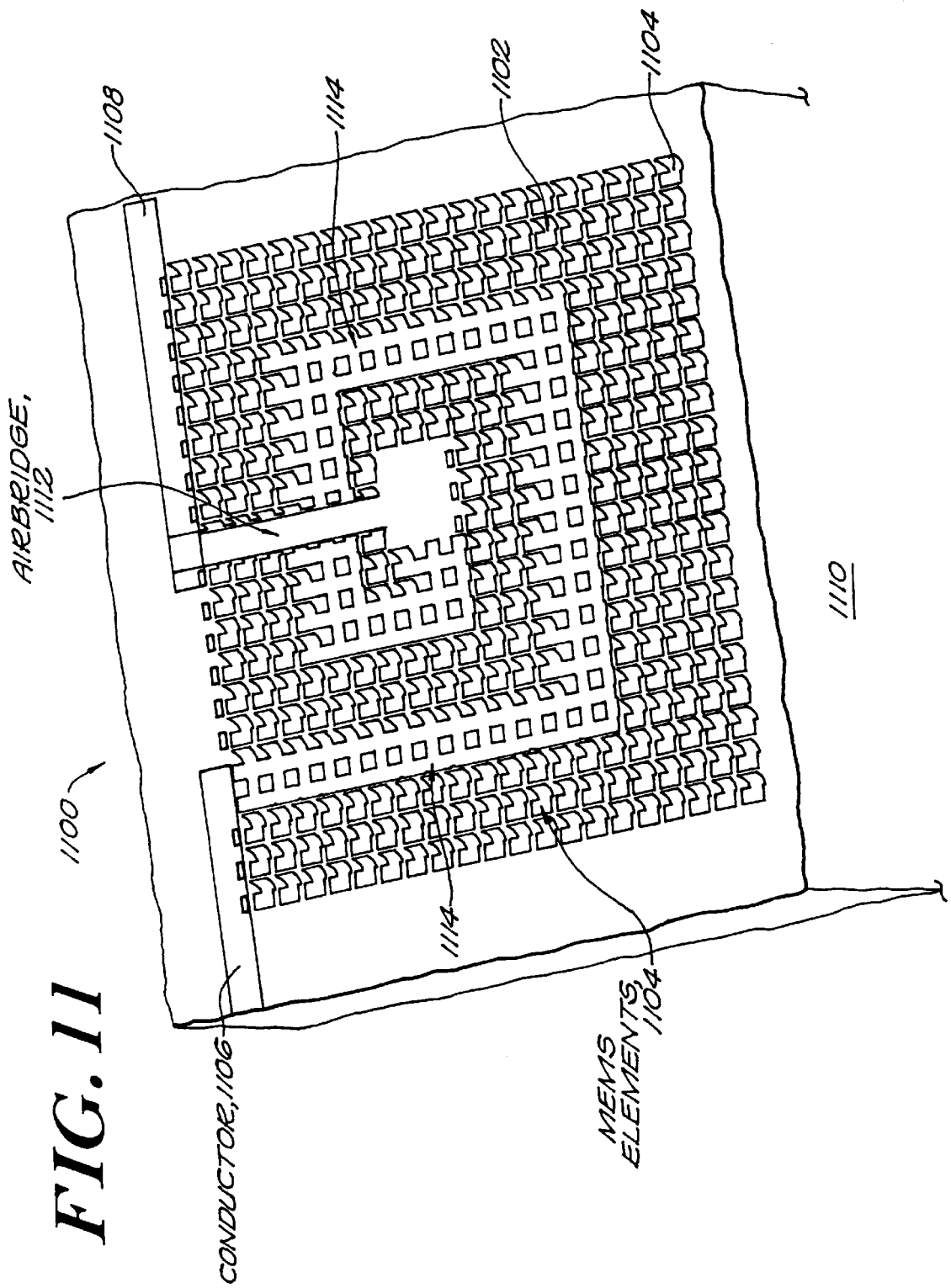

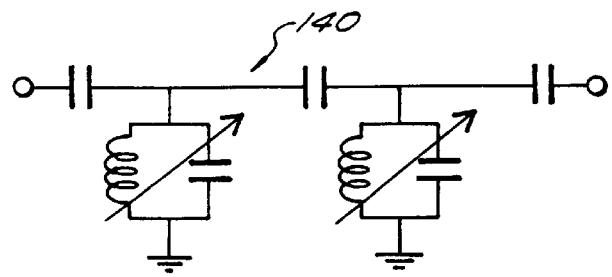
FIG. 14A
FIG. 14B
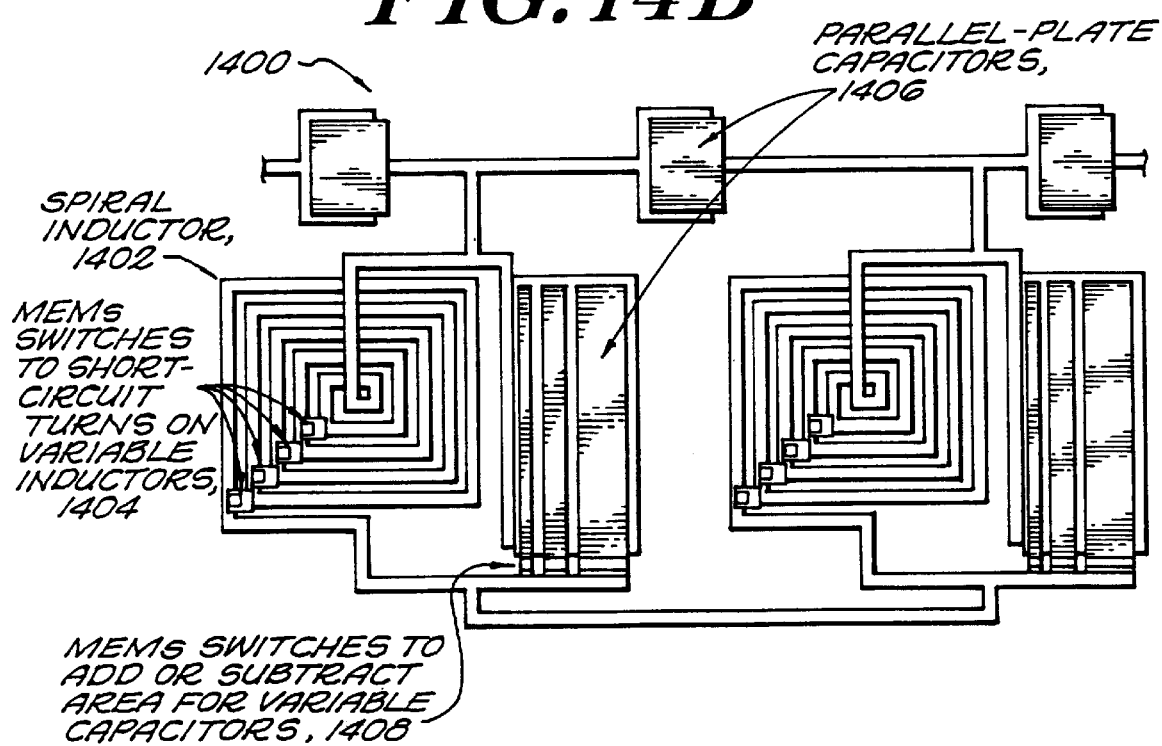

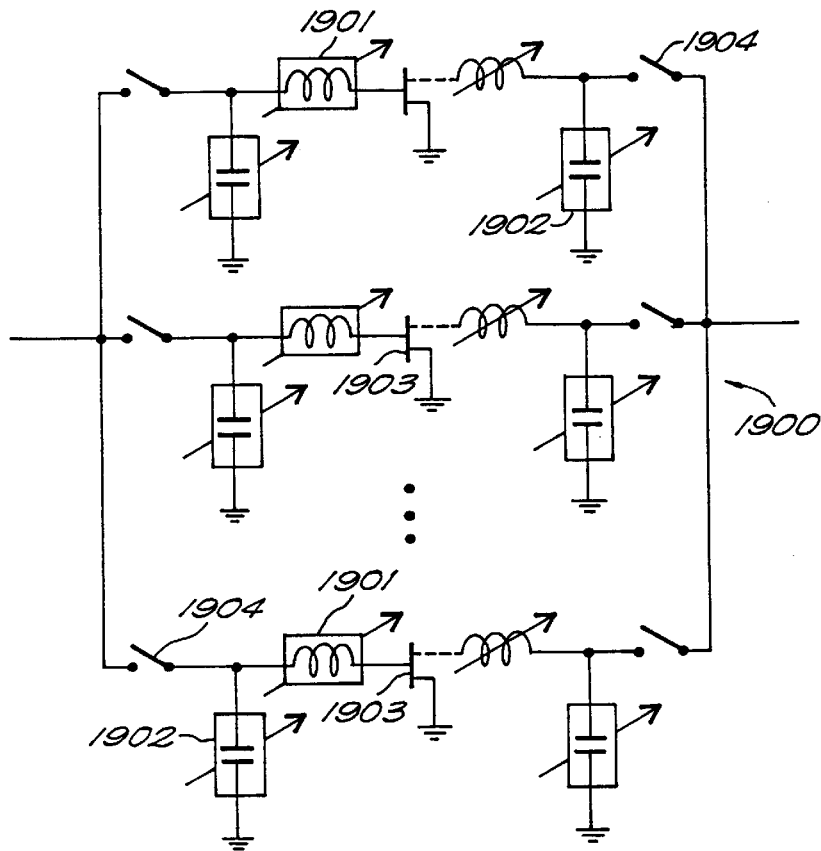
FIG. 19
FIG. 20
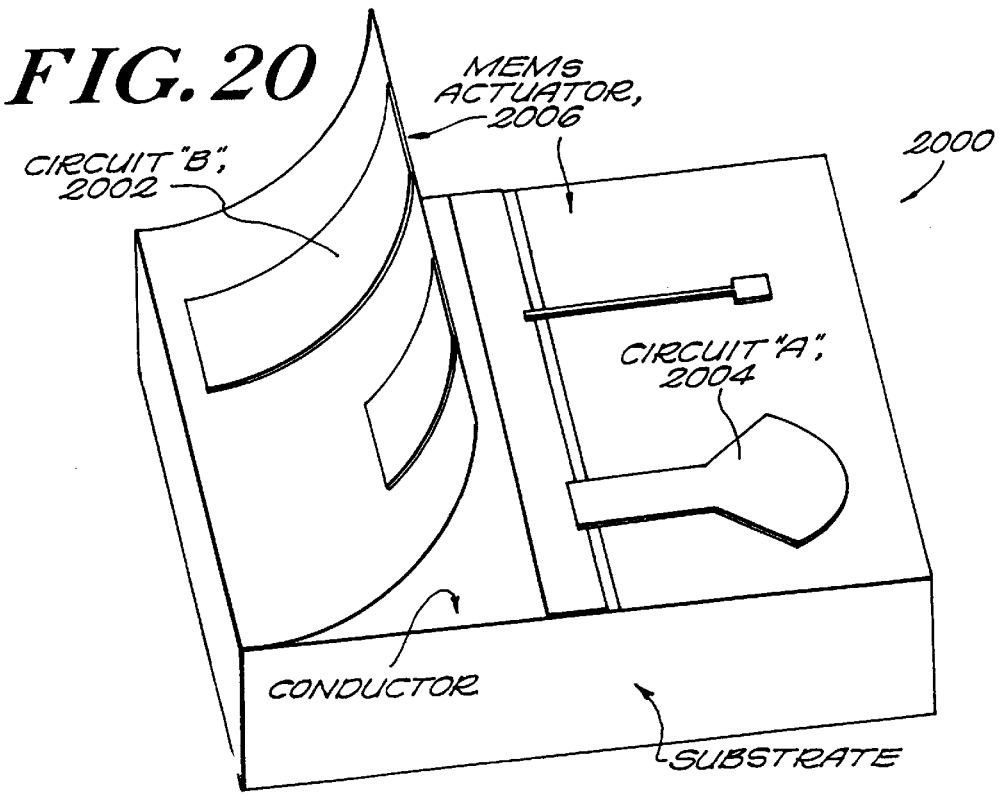

MICROELECTRO-MECHANICAL SYSTEM ACTUATOR DEVICE AND RECONFIGURABLE CIRCUITS UTILIZING SAME

SPONSORSHIP INFORMATION

This invention was made with government support under Contract No. F19628-95-C-002 awarded by the U.S. Air Force. The government has certain rights in the invention.

BACKGROUND OF THE INVENTION

The invention relates to microelectro-mechanical actuator devices and the use of arrays of these devices to provide reconfigurable circuits.

A common method of tuning prototype microwave circuits, or even fine tuning production circuits, is to selectively add or subtract tuning elements from the circuit while monitoring the effect of such tuning on a network analyzer. In the case of a microstrip circuit, the addition or subtraction of conductor metal, which changes the size and shape of the microstrip line, will alter the impedance characteristics of that line.

The advantage of this technique is that compensation can be added to account for differences in "ideal" modeled matching networks and the "real world" realization of those networks. In fact, it is not necessary for a modeled matching network to exist. A component can be matched to the preceding and following stages working from "scratch" with no prior knowledge of the circuit matching requirements. These techniques add flexibility to circuit design by allowing microwave integrated circuits (MICs) to be modified quickly without the need of a complete fabrication cycle run.

Disadvantages of this technique are that it takes a skilled and patient operator to tune the circuit and secure the tuning elements so that the performance of the circuit remains constant over time. Positioning of tuning elements is quite tedious as errors in element positioning of a few thousandths of an inch will dramatically affect circuit performance, especially at higher frequencies. These problems also make repeatability a problem. It is very difficult to manually reproduce a certain arrangement of tuning elements.

Conventional microstrip circuits are fine tuned by hand to optimize performance with modeled impedance matching networks that are fabricated on the substrate along with "chicken dots" or "confetti" to which additional tuning elements can be attached, if necessary. In this case, gold mesh patterns are added to the circuit and attached with a thermo-compression bonder.

A means by which tuning elements can be modified quickly, easily, and repeatably would significantly impact microwave circuit design and implementation. Tuning elements which can be reconfigured remotely and on demand would open up a new area of dynamic circuit tuning.

SUMMARY OF THE INVENTION

The invention is the mechanism which provides the aforementioned tuning capabilities. One application of the invention is to fabricate an array of microelectro-mechanical system (MEMS) tuning elements described herein as part of a microwave circuit. Deploying selected portions of the array would be the equivalent of adding metal conductor pattern to the microwave circuit. The MEMS tuning elements can be deployed in whatever pattern necessary to realize the appropriate microwave circuitry. The deployment of the individual tuning elements can be computer controlled, giving this technique great advantages over the manually tuned method described above. It is also possible to reconfigure the MEMS tuning element array to realize any circuit configuration desired. These modifications of the microwave circuit can be realized very quickly with great accuracy and repeatability.

The application of the MEMS tuning elements described above is but one of many uses envisioned. Some other applications are described hereinafter with reference to exemplary embodiments.

Accordingly, the invention provides a microelectro-mechanical device which includes a fixed electrode formed on a substrate, the fixed electrode including a transparent, high resistance layer, and a moveable electrode formed with an anisotropic stress in a predetermined direction and disposed adjacent to the fixed electrode.

The device includes first and second electrically conductive regions which are isolated from one another by insulator layers on the moveable and fixed electrodes and/or by an air gap, the moveable electrode being electrically coupled to the first conductive region. The moveable electrode moves close to and covers the fixed electrode, which changes the electrical coupling to the second conductive region, thus enhancing the electrical coupling of the first and second conductive regions, in response to a potential being applied across the fixed and moveable electrodes. The enhanced electrical coupling between the moveable electrode and the second conductive region is small when the moveable and fixed electrodes are far apart, and thus there is a high resistance or high impedance. When the two electrodes are close together, there is a high coupling, low resistance or low impedance contact. The fixed electrode is transparent to electromagnetic signals or waves and the moveable electrode impedes or allows transmission of electromagnetic signals or waves through the device depending on its position relative to the first and second conductive regions. In one embodiment of the invention, the fixed and moveable electrodes are configured within an array of similar devices, and each device or groups of devices in the array are individually addressable to actuate the moveable electrodes.

In another embodiment of the invention, there is provided a reconfigurable circuit including an array of actuatable devices which are addressed individually or in selected groups, each of the actuatable devices having a fixed electrode formed on a substrate, the fixed electrode including a transparent, high resistance layer, and a moveable electrode formed with an anisotropic stress in a predetermined direction and disposed adjacent the fixed electrode. Each of the actuatable devices includes first and second electrically conductive regions which are isolated from one another by the fixed electrode, the moveable electrode being electrically coupled to the first conductive region. The moveable electrode moves to cover the fixed electrode and to electrically couple to the second conductive region, thus electrically coupling the first and second conductive regions, in response to a potential being applied across the fixed and moveable electrodes. The fixed electrode is transparent to electromagnetic signals or waves, and the moveable electrode impedes or allows transmission of the electromagnetic signals or waves depending on its position relative to the first and second conductive regions.

BRIEF DESCRIPTION OF THE DRAWINGS

FIGS. 6A, 6B, 6C, 6D, 6E, 6F, 6G and 6H are a series of schematic sectional views showing the steps in fabricating a MEMS actuator device in accordance with the invention;

FIG. 9C is a perspective view of the configuration shown in FIG. 9A in which some of the MEMS devices used as tuning elements are actuated;

FIG. 11 is a perspective view of a reconfigurable variable spiral inductor in accordance with the invention;

FIG. 14A is a schematic circuit diagram of a tunable bandpass filter using variable inductors and capacitors;

FIG. 14B is a plan view of a schematic diagram of an exemplary tunable band-pass filter which utilizes MEMS devices to tune element values;

FIG. 19 is a schematic diagram of a variable L-C match RF amplifier circuit; and FIG. 20 is a perspective view of a MEMS binary switched circuit in accordance with the invention.

DETAILED DESCRIPTION OF THE ILLUSTRATED EMBODIMENTS

Figure 1A:
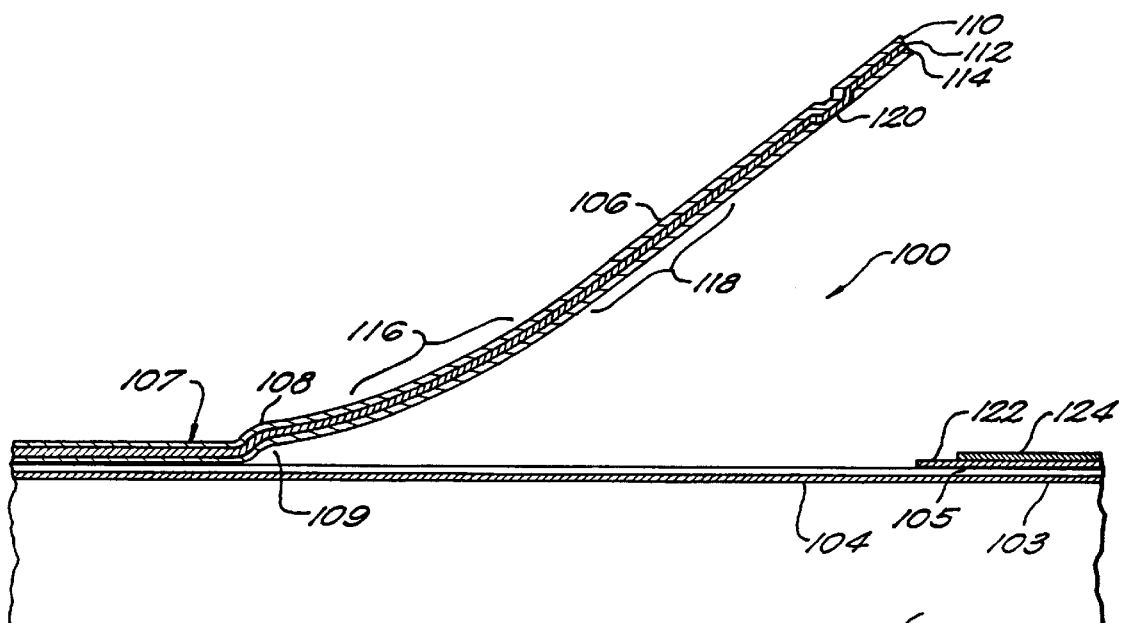
FIGS. 1A, 1B and 1C are schematic sectional views of a MEMS actuator device 100, in accordance with an exemplary embodiment of the invention, in open, partially closed, and completely closed positions, respectively.
Figure 1B:
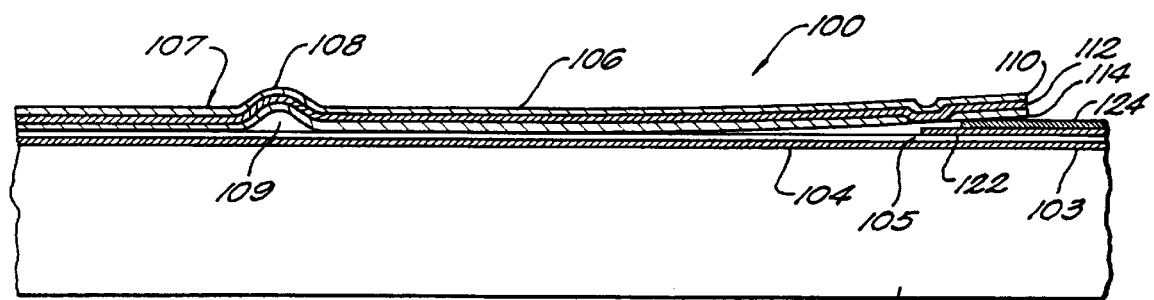
Figure 1C:
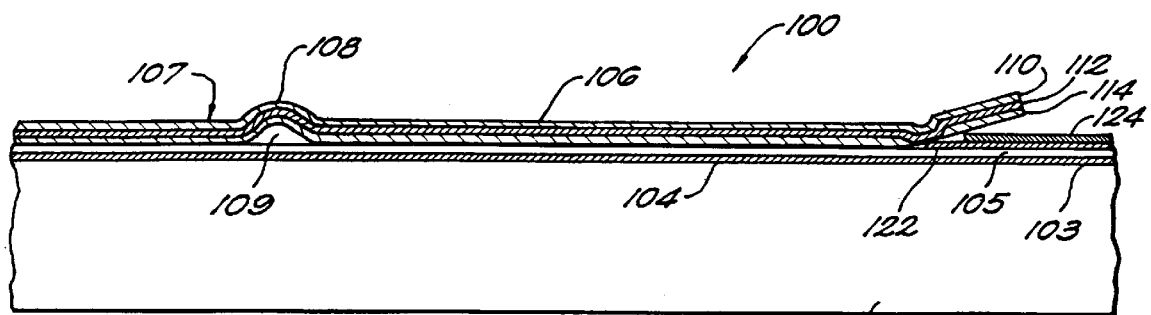

FIGS. 1A–1C are schematic sectional views of a MEMS actuator device 100, in accordance with an exemplary embodiment of the invention, in open, partially closed, and completely closed positions, respectively. The MEMS actuator device consists of an insulating substrate 102, such as glass or fused silica, having a layer 103 of high resistance material on it which defines a fixed high resistance electrode 104. The layer 103 can have a pattern which depends on the particular design of the device, and serves as the fixed electrode. On top of the high resistance layer an insulating layer 105 is formed. Spaced apart from and above the substrate is a moveable electrode 106 which is attached to the substrate at one end at an attachment point 107. The electrode 106 is formed so that it has a step 108 adjacent to where it is attached to the substrate to provide a small gap 109 which helps to provide bistability.

The movable electrode 106 is a membrane which is about 1 $\mu$m thick and about 50 $\mu$m long from the attachment point 107 to its free end. The electrode 106 is fabricated with an anisotropic stress in a predetermined direction, e.g., so as to promote the electrode to coil up towards the attachment point in a non-actuated position. It is made to curve upward for the half of its length nearest the attachment point and it is made flat, or nearly flat in the half further out, so that the gap between the movable electrode 106 and the fixed electrode 104 is around 12 $\mu$m. The membrane defining the moveable electrode 106 consists of three layers: a first insulating layer 110 of silicon dioxide, about 1000 Å thick and having tensile stress; a conductor layer 112 of aluminum, about 5000 Å thick; and a second insulating layer 114 of silicon dioxide, about 1000 Å thick, and having compressive stress.

The shape, or curvature, of the membrane defining the moveable electrode 106 is determined by the stress of the layers built in during fabrication, and by using corrugations which are perpendicular to the plane of the view in FIGS. 1A–1C for the curved up region 116 of the membrane, and corrugations which are parallel to the plane of the view in the flat region 118 of the membrane. In addition to the corrugations, the membrane shape is slightly modified near the free end to allow the aluminum to be exposed at region 120 through the insulating layer 114 at the bottom of the membrane. The purpose of this configuration is to provide a metal to metal contact between the movable electrode 106 and a fixed electrode 122 as is shown in FIG. 1C.

When a voltage is applied between electrodes 104 and 106 an electric field and therefore a force is created which, if the voltage is sufficiently large, pulls down the moveable electrode 106 into contact first with substrate near the attachment point 107, and with a rolling action eventually brings the insulating layer 114 at the end of the movable electrode 106 into contact with an insulator layer 124 provided on top of the fixed electrode 122. Since the end of the movable electrode is stiffened by the corrugations, it will not bend very much. The corrugations run parallel to the plane of view from about the center of the membrane to near the end and stop before they get to where the aluminum is exposed at region 120 at the bottom of the membrane. The region 118 of corrugations is referred to as the plate.

The force at the contact point shown in FIG. 1B is enhanced by the plate so that the membrane will bend more sharply and bring the metal of electrodes 106 and 122 into contact. Since the large force is used to bring the metals into contact, as long as there is no plastic deformation, the spring action of the bent membrane will provide a larger force pulling the contacts apart when the voltage is removed. The enhanced force at contact and release of contact is an important feature of the device for two reasons. First, a larger contact force can result in a lower resistance contact. Second, metal to metal contacts are much stickier than insulator to insulator contact, and the enhanced release force will reduce the probability that the contacts will stick.

For many applications of MEMS actuator devices, the contact resistance when the device is closed is required to be less than one ohm, and sometimes considerably less than one ohm. Low resistance contacts require intimate metal to metal contact with very little oxide or other contamination between the contacting metal surfaces.

Intimate contact of two metal surfaces also implies that the two metals will have a tendency to stick together when the release force is applied. The device can contain a means of increasing the release force, by twisting lever action for example, to eliminate the sticking effect. During the opening process there is a twisting and a compressive force in the moveable electrode which will become large if there is any sticking, plus a lever action when the insulating layer 114 at the end of the moveable electrode comes in contact with the insulator layer 124.

Figure 2A:
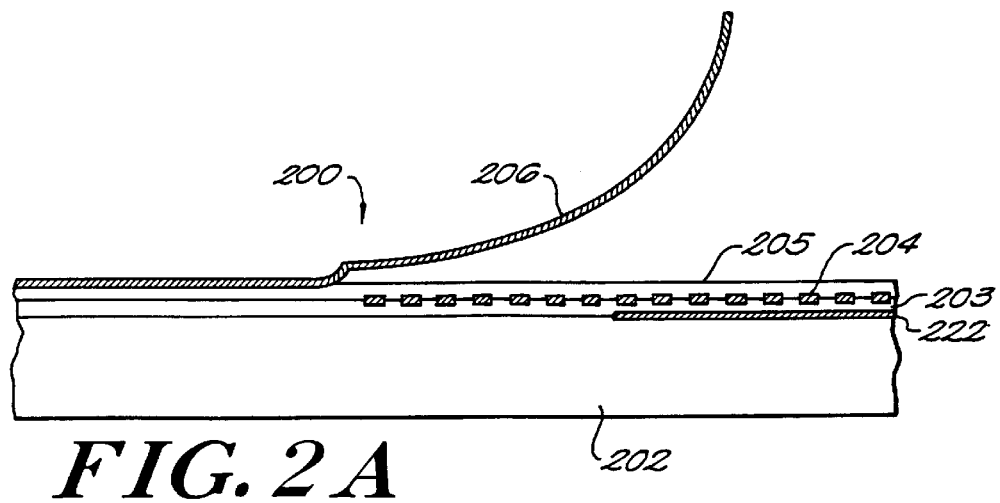
FIGS. 2A and 2B are schematic sectional views of a MEMS actuator device in accordance with the invention in open and closed positions, respectively.
Figure 2B:
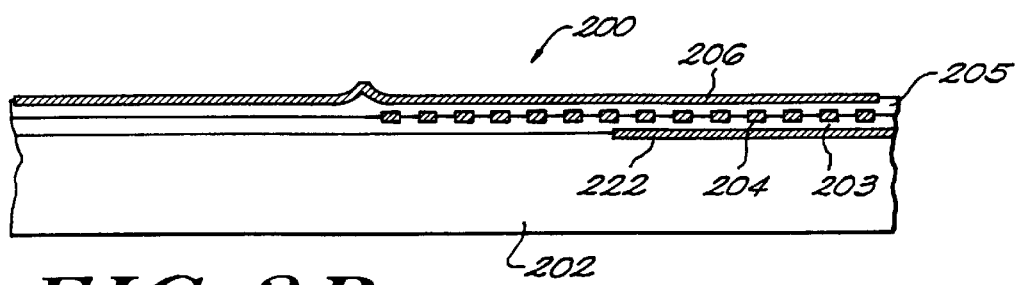

The device 100 described with reference to FIGS. 1A–1C is only one of many possible designs for a MEMS actuator device. For example, a device could be designed having the same high resistance electrode and having a movable electrode which does not make a DC metal to metal contact with the fixed contact electrode, but rather an insulator to insulator, or capacitive contact. Such a device is shown in FIGS. 2A and 2B, which illustrate simplified schematic sectional views of a MEMS actuator device 200 in open and closed positions, respectively, in accordance with the invention. The device 200 includes a substrate 202, a metal or conductive layer defining a fixed electrode 222, an insulating layer 203, a high resistance layer defining a high resistance fixed electrode 204, a second insulating layer 205, and a moveable electrode 206.

Figure 3A:
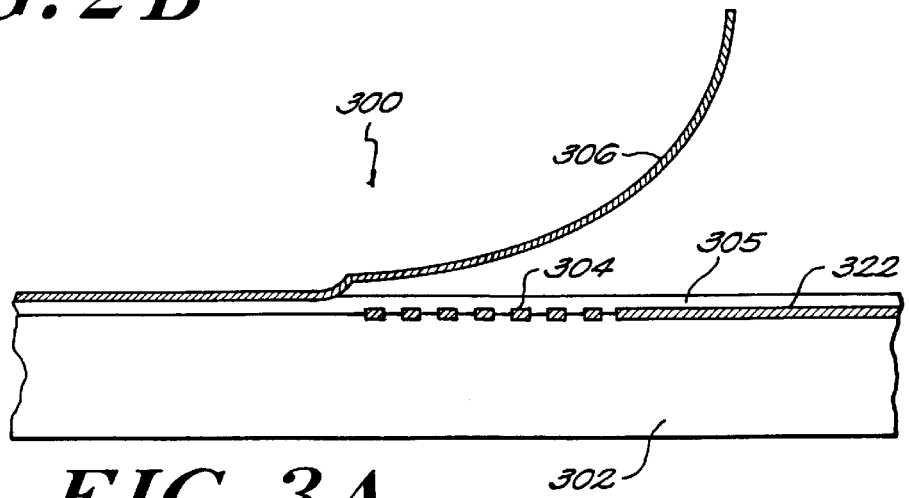
FIGS. 3A and 3B are schematic sectional views of a MEMS actuator device in open and closed positions, respectively, in accordance with an alternative embodiment of the invention.
Figure 3B:
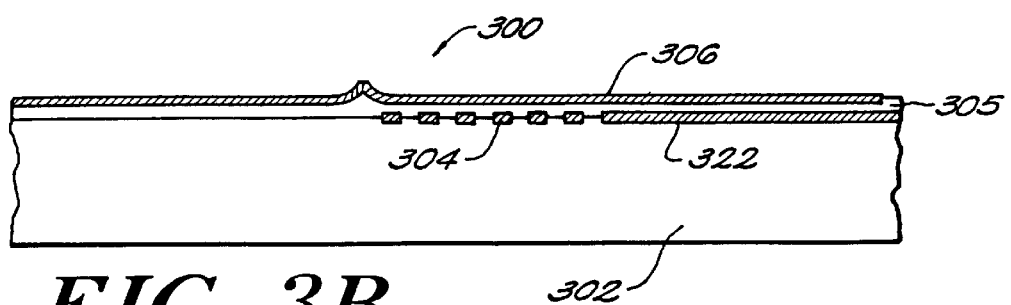

Alternatively, FIGS. 3A and 3B are schematic sectional views of a MEMS actuator device 300 in open and closed positions, respectively, in accordance with the invention. The device 300 includes a substrate 302, a layer defining both a fixed low resistance electrode 322 and a high resistance fixed electrode 304, an insulating layer 305, and a moveable electrode 306. The device 300 can be used as a variable capacitor, or as a capacitive switch and can provide a large impedance change. The actuation of the movable electrode would be the same as described in the previous examples.

The advantage of the device 200 over device 300 is that the actuating electrode 204 is electrically isolated, which reduces the need for a filter in the actuation voltage feed line.

The advantage of the device 300 is that the configuration is slightly easier to build.

Figure 4A:
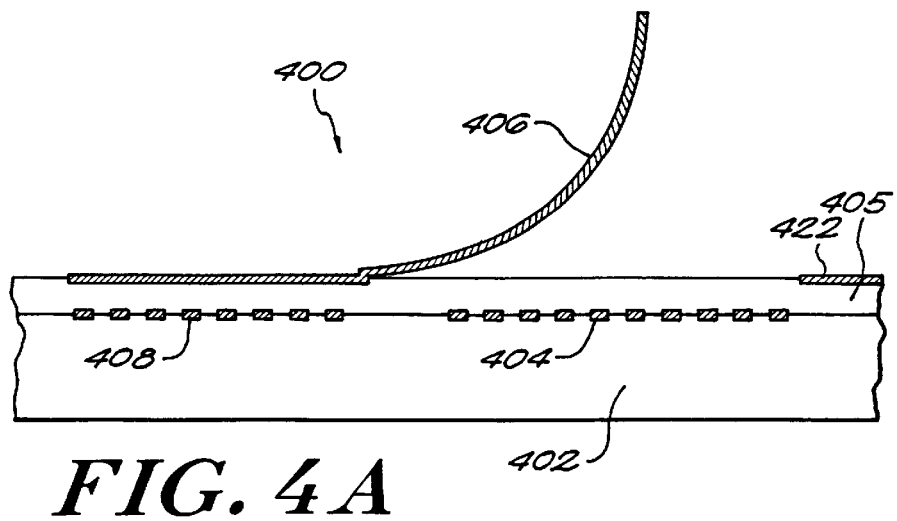
FIGS. 4A and 4B are schematic sectional views of another alternative embodiment of a MEMS actuator device in accordance with the invention, in open and closed positions, respectively.
Figure 4B:
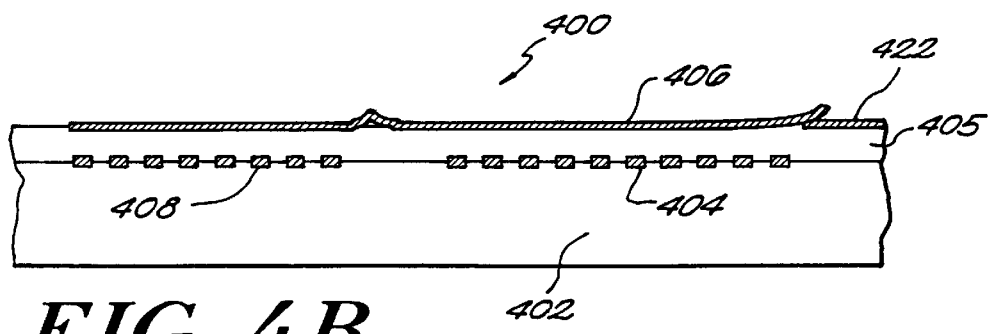

FIGS. 4A and 4B are schematic sectional views of another alternative embodiment of a MEMS actuator device 400 in accordance with the invention, in open and closed positions, respectively. The device 400 includes a substrate 402, a high resistance layer defining both a first high resistance fixed electrode 404 and a second high resistance fixed electrode 408, an insulating layer 405, a fixed electrode 422, and a moveable electrode 406.

The device 400 is designed so that the voltage for actuation is not applied directly between electrode 404 and moveable electrode 406. Rather, the voltage is applied between electrode 404 and electrode 408, and then capacitive coupling occurs between electrode 408 and the base of the moveable electrode 406 which induces a voltage on the moveable electrode. The advantage of this design is that both the actuation drive electrodes 404 and 408 are isolated from the required RF circuitry.

Figure 5A:
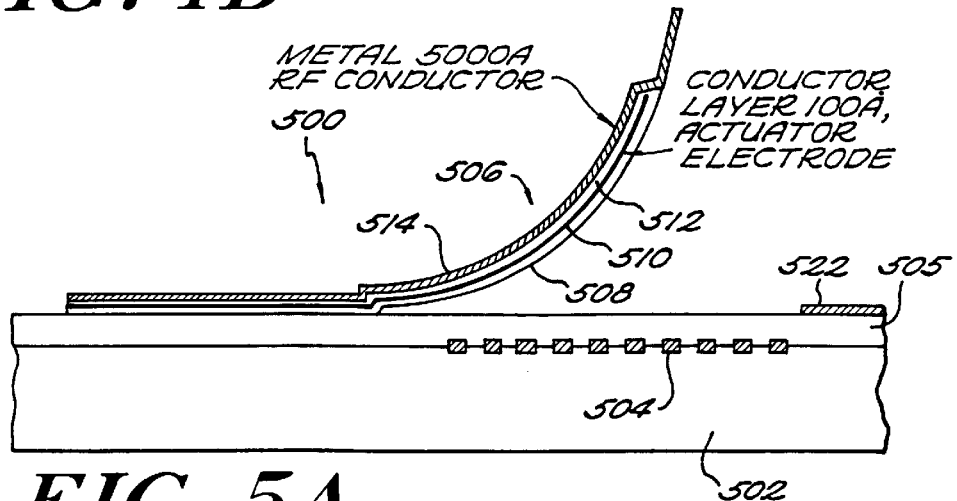
FIGS. 5A and 5B are schematic sectional views of another alternative embodiment of a MEMS actuator device in accordance with the invention, in open and closed positions, respectively.
Figure 5B:
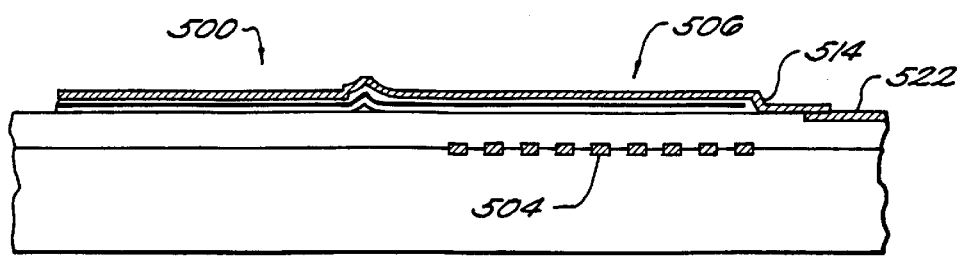

An advanced design is shown in FIGS. 5A and 5B, which illustrate schematic sectional views of another alternative embodiment of a MEMS actuator device 500 in accordance with the invention, in open and closed positions, respectively. The device 500 includes a substrate 502, a high resistance layer defining high resistance fixed electrode 504, an insulating layer 505, and a fixed electrode 522. A moveable electrode 506 is a multi-layered membrane including a first insulating layer 508 (e.g., silicon dioxide), an actuator electrode 510 (e.g., 100 Å conductive layer), a second insulating layer 512, and a RF conducting electrode 514 (e.g., 5000 Å metal layer).

The device 500 has two high resistance electrodes both isolated from the RF electrodes as in the device 400 except that in this case the electrode 510 is now disposed just underneath the RF electrode 514. The electrodes 510 and 514 are both layers of the movable electrode separated by the insulating layers. The electrode 510 is DC isolated from all other electrodes, which will allow a great deal of flexibility in the design of switching arrays. The configuration of the device 500 may be optimal for XY addressing of RF switching arrays, where the switches themselves are bistable and therefore memory elements. The uses of the switch arrays will be discussed hereinafter. The method of XY addressing is similar to that used for microshutter display applications as described in U.S. Pat. No. 5,233,459, incorporated herein by reference.

An exemplary fabrication process for a MEMS actuator device 600 in accordance with the invention will now be described with reference to FIGS. 6A–6H. The process begins in FIG. 6A with a glass substrate 602, such as fused silica or Corning 7059. Other substrates such as ceramic, silicon and gallium arsenide will also work in the same way. The thickness of the substrate will depend on the requirements and design of the final electrical circuit or waveguide and can be in the range of 5 to 50 mils.

A layer 604 of polysilicon 500 Å thick is deposited on the substrate using standard processes used in conventional silicon integrated circuit fabrication. The layer 604 is implanted with boron and annealed to give a sheet of resistance of approximately 100,000 ohm per square. The polysilicon is then patterned using plasma dry etching with SF6 gas and photoresist as the mask. The design of the etch pattern will help determine which device or groups of devices can be addressed separately. Next, a layer 606 of silicon dioxide 2000 Å thick is deposited, using for example silane and oxygen gas in a plasma enhanced chemical vapor deposition (PECVD) system. Thereafter, via holes are etched through the first silicon dioxide layer out away from the active device area using photoresist as the mask and BHF as the etch.

Figure 6A:
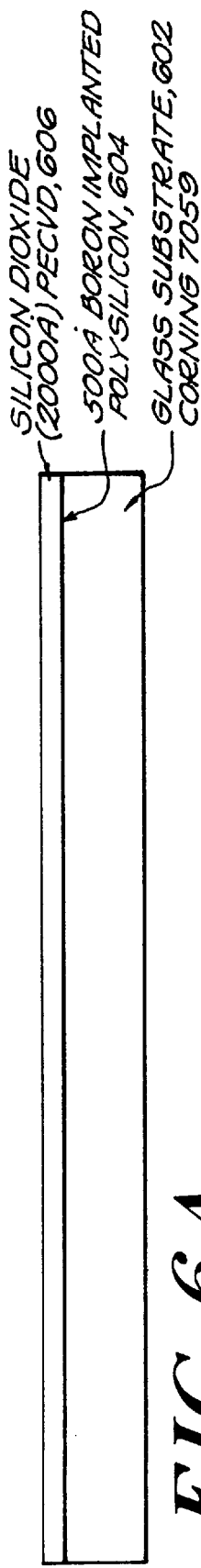
Figure 6B:
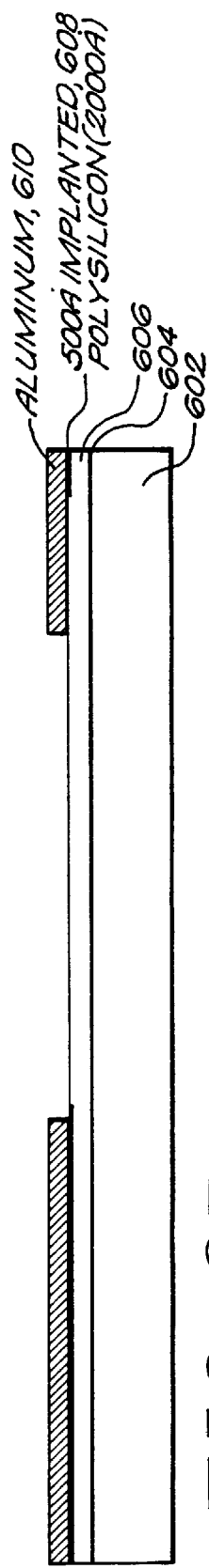

A layer 608 of polysilicon 500 Å thick is deposited, as shown in FIG. 6B, on the substrate 602 using standard processes used in conventional silicon integrated circuit fabrication. The layer 608 is implanted with boron and annealed to give a sheet resistance of around 100,000 ohm per square. The polysilicon is then patterned using dry etching with SF6 gas and photoresist as the mask. The design of the etch pattern will determine which device or groups of devices can be addressed separately. A layer 610 of 5000 Å aluminum is next deposited using evaporation or sputtering. The aluminum layer 610 is patterned using photoresist as a mask and a commercially available wet etch. The aluminum must make an electrical contact with the polysilicon which has a resistance which is in the range of 100–100,000 ohm/square. The aluminum is coated with an optional layer of platinum or other conductive contact material approximately 50 Å thick. The next step is optional, in which the silicon dioxide layer is patterned with small bumps, nominally 500 Å high which will help reduce sticking during switch operation. One method for forming the bumps is to coat the wafer with an ultra thin layer of aluminum, 20 Å, and then etching in the RIE. The aluminum layer will be discontinuous islands and form a mask against the RIE.

Figure 6C:
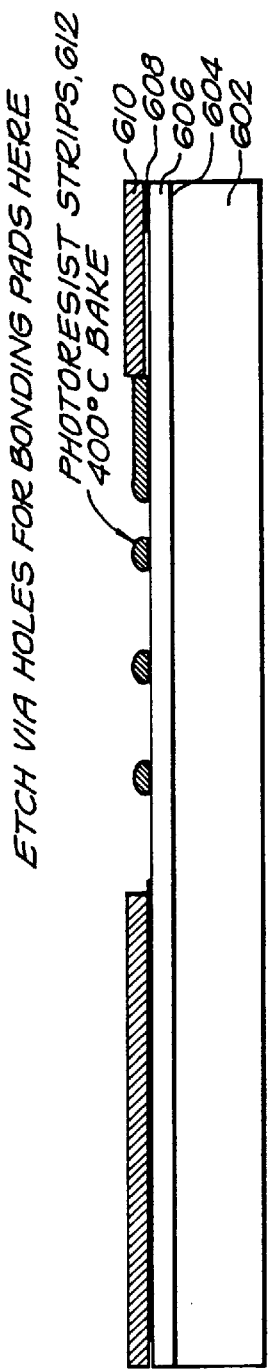

In FIG. 6C, photoresist is then applied and patterned on the wafer to form photoresist strips 612 which will later be the corrugations in the moveable electrode. The photoresist is then baked at 400° C. to make it stand up to the following processing steps.

The wafer is then coated with a layer 614 of 3000 Å molybdenum by evaporation or sputtering as shown in FIG. 6D, which is patterned using photoresist as a mask and a plasma dry etch process with the gasses carbon tetraflouride and oxygen. The conditions of the etch are adjusted to create a tapered edge 615 between the top surface of the molybdenum film and the silicon dioxide. The layer of molybdenum will then serve as the release layer.

The wafer is next coated with a 1000 Å thick layer 616 of silicon dioxide, as shown in FIG. 6E, which has a specific amount of compressive stress using a PECVD system. The amount of stress is adjusted and controlled using the deposition conditions to help produce the desired curvature of the moveable electrode after release. This layer when combined with the next two layers will form the movable electrode. The layer 616 is patterned using photoresist as a mask and buffered hydrofluoric acid (BHF). The wafer is coated with an optional layer of platinum or other conductive contact material approximately 50 Å thick.

The wafer is then coated with a 5000 Å layer 618 of evaporated or sputtered aluminum having low stress, as shown in FIG. 6F. Thereafter, the wafer is coated with a 1000 Å thick layer 620 of silicon dioxide using a PECVD system which has a specific amount of tensile stress. As with the compressive layer 616, the amount of stress is adjusted and controlled using the deposition conditions to help produce the desired curvature of the moveable electrode after release.

Figure 6G:
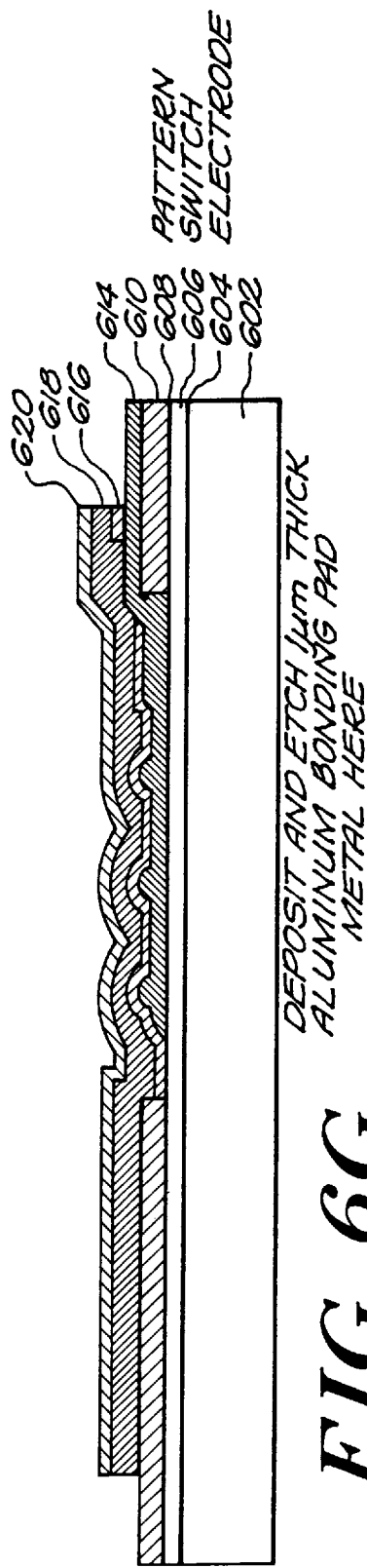

The three layers (616, 618 and 620) previously deposited are next patterned, as in FIG. 6G, with photoresist and etched using wet or dry processing. In the wet process, the silicon dioxide is etched with a buffered hydrofluoric (BHF) acid which will not etch aluminum, the aluminum is etched in a commercially available aluminum etch, the bottom silicon dioxide is also etched in BHF. This patterning step forms the individual movable electrodes of the device after they are released.

The wafer is then coated with photoresist and patterned for the contact pads. A 1 μm layer of aluminum is next sputtered or evaporated over the resist. The aluminum layer is then patterned with the contact pad array pattern using photoresist and a mask as before. The remaining resist is then removed using conventional techniques.

Figure 6H:
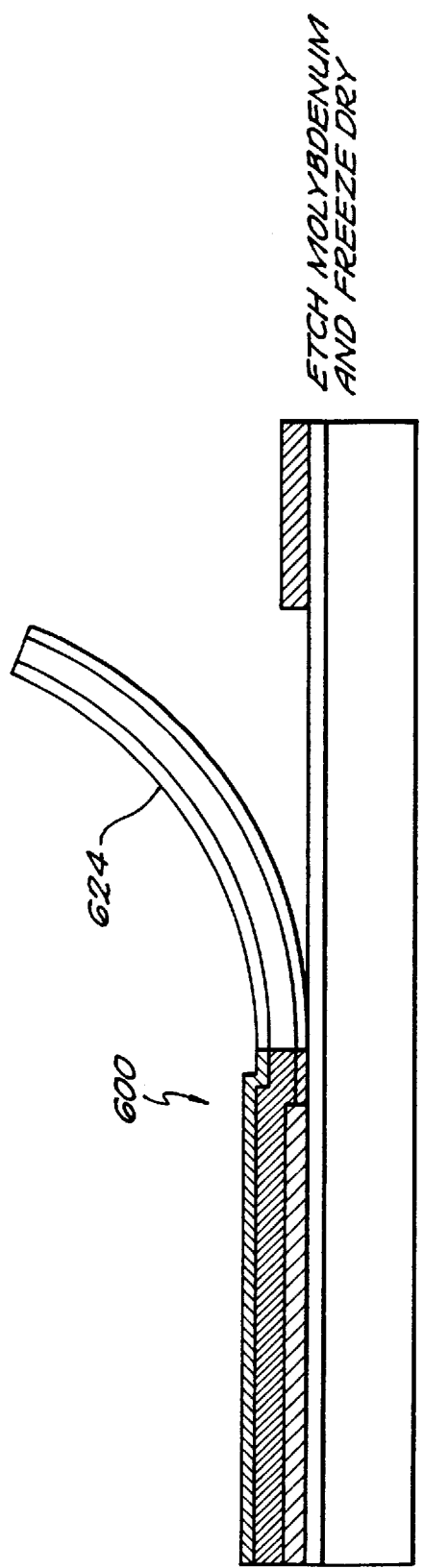

The next step is to cut the wafer into individual chips. The chips are then placed in a release system where movable electrodes are then released from the substrate by etching away the molybdenum as shown in FIG. 6H. The etching of the molybdenum can be done with hydrogen peroxide, which is rinsed with water, acetone, and then cyclohexane in the release system. The chips in the system are then cooled to −10° C., to freeze the cyclohexane and purged with nitrogen at low pressure to evaporate away the cyclohexane. The moveable electrode 624 is now curled up away from the substrate. The chips are now ready for testing, packaging and operation.

When designing a MEMS actuator device as previously described, due to the properties of the materials of construction the moving electrode or membrane will often have a different expansion coefficient or strain than the substrate. This difference will create stress along the line of attachment of the membrane with the substrate. The stress could in turn cause buckling or distortion of the membrane. In order to reduce this effect, two structural modifications can be made along the line of attachment. First, one can introduce ridges along the line of attachment, the ridges being perpendicular to the line of attachment. The ridges have the effect of reducing the rigidity of the membrane along the line of attachment and will allow many small buckles to occur at the ridges, resulting in reduced stress and reduced large scale buckling in the membrane further from the attachment line. The second way to achieve reduced buckling is to make small slots in the membrane where the slots are again perpendicular to the line of attachment. The slots will have a similar effect as the ridges.

Figure 7:
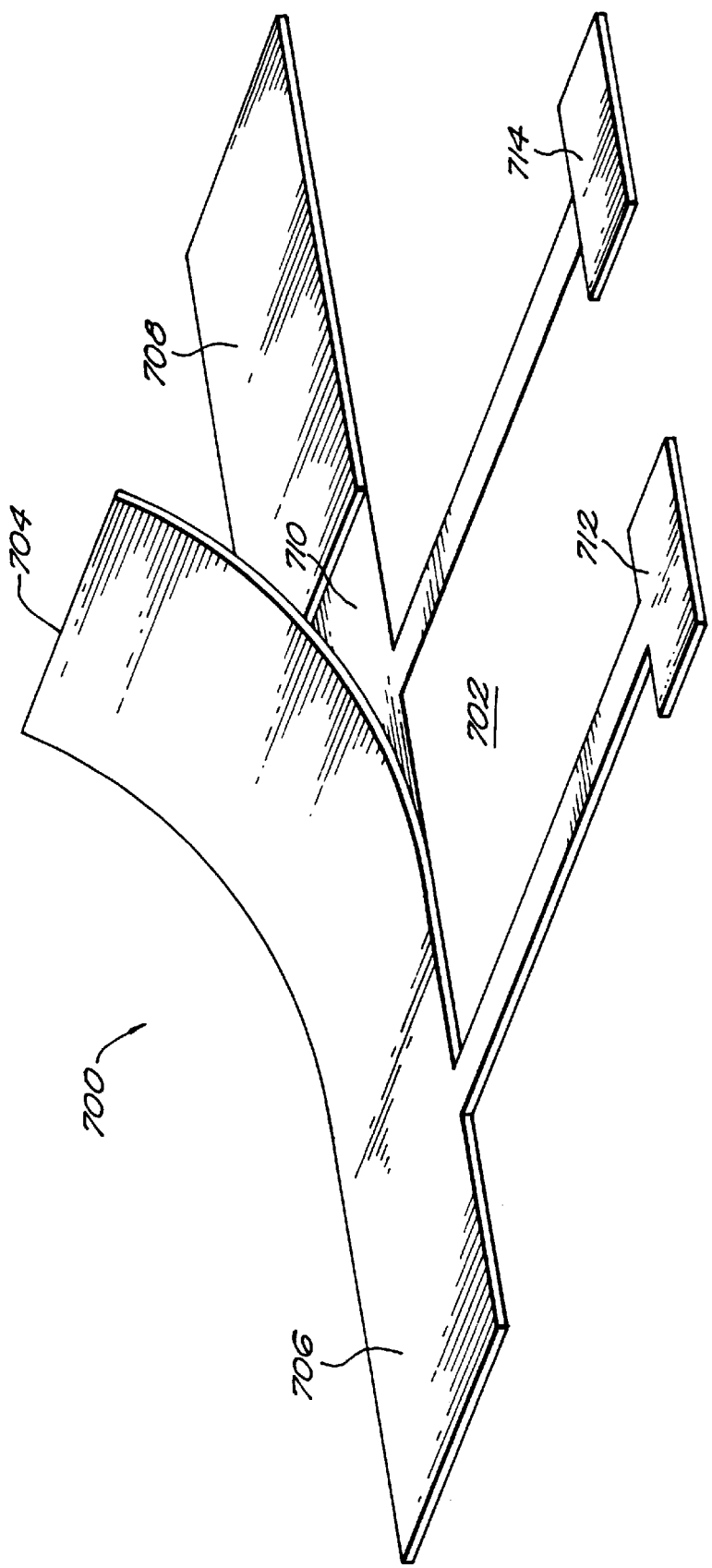
FIG. 7 is a perspective view of an exemplary MEMS actuator device in accordance with the invention.

FIG. 7 is a perspective view of an exemplary MEMS actuator device 700 in accordance with the invention. The device 700 is configured on a substrate 702 and includes a moveable electrode 704 with a first conductive region (anchor pad) 706. The device also includes a second conductive region (fixed electrode) 708 and a fixed, high resistance actuator electrode 710 disposed beneath the moveable electrode. Electrical contacts 712 and 714 are provided to supply voltages to the anchor pad 706 and moveable electrode 704, and the electrode 710, respectively.

In this configuration, the device 700 is a simplistic reconfigurable circuit, for example a switch, in which the first conductive region 706 is electrically isolated from the second conductive region 708 by a gap and with the electrode 710 isolated from both. An electrical circuit or path is formed when the device is actuated by applying a voltage between contacts 712 and 714, and the moveable electrode 704 closes to contact the electrode 708.

When the switch of the invention is used to modulate AC signals, especially at frequencies above 1 MHz, the capacitances between the conductive regions will provide a shunt path across the switch. The shunt path effectively reduces the impedance or resistance between regions 706 and 708 when the switch is open. If the electrode 710 is made to have a high resistance (greater than 1000 ohms per square where the actual value will depend on the frequency range of operation), the shunt path can be essentially eliminated. The electrode 710 has a high resistance and can be considered to be transparent or invisible to the high frequency signal and will have essentially no effect on it. The impedance of the switch when it opens will then be determined by the capacitance between the electrode 704, and regions 706 and 708 when the electrode 704 is in the non-actuated state.

Figure 8:
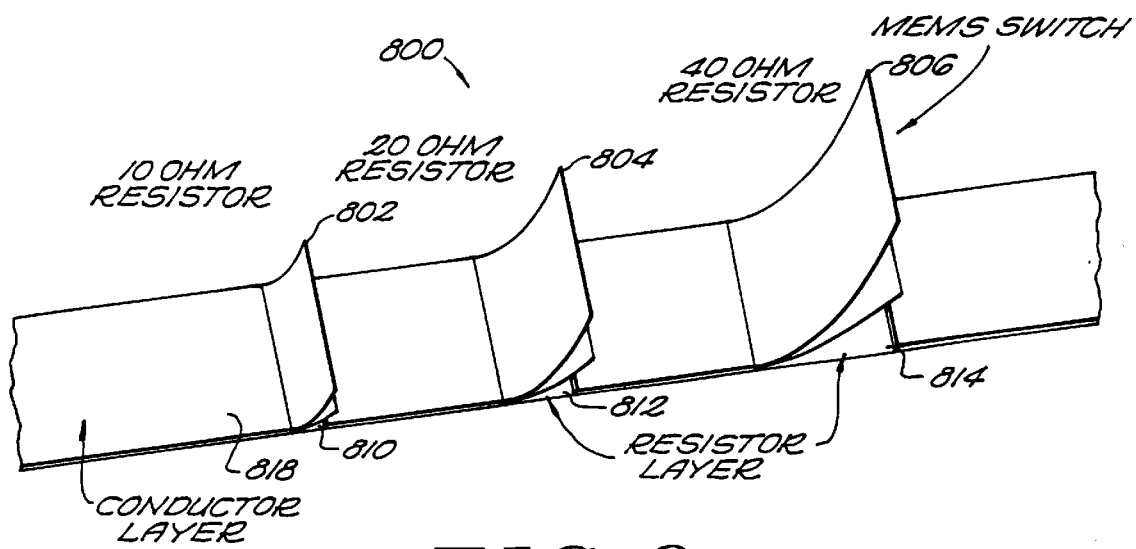
FIG. 8 is a perspective view of a variable resistor using MEMS actuator devices of the invention.

As another example of the MEMS actuator devices of the invention being configured as a reconfigurable circuit, FIG. 8 is a perspective view of a variable resistor 800. The variable resistor 800 is realized by fabricating a series of MEMS devices 802, 804, 806 on a conductor path 808 that contains thin film resistors 810, 812, 814 of differing values. The MEMS devices are positioned such that when a device is in the deployed state, one of the resistors is shorted out by that device and effectively removed from the circuit. When the device is retracted, the resistor becomes part of the conducting path and that value of resistance is added to the circuit. By using many devices along with resistors of predetermined values, a wide range of resistances can be realized by strategically selecting which devices are actuated.

In an embodiment of the invention, the device 700 is arranged in an array of similar devices having the electrodes connected in either rows or columns to provide XY addressing of the array of devices. Such an array of devices could be used, for example, as tuning elements in a microwave circuit. As described earlier, the contact pads are in very close proximity to the effective RF conducting path, they could provide a shunt path which is potentially a significant cause of circuit performance degradation. RF energy coupled to the actuator circuitry would show up as "ON" state loss and undesired "OFF" state coupling.

The use of polysilicon to form the interconnect actuator bias lines greatly reduces the potential of circuit degradation. A highly resistive layer of polysilicon (>10K ohm/square) would conduct very little RF energy at microwave frequencies, but would still support the DC electrostatic fields required for actuation. The high impedance at microwave frequencies would mean that the control circuitry would be invisible to the RF signal. The bias lines to the individual elements could be made on a polysilicon layer separate form the actuator pads. This would also reduce "OFF" state coupling between elements.

As configured, the high resistance electrode 710 of device 700 is preferably transparent to electromagnetic signals or waves such as microwaves, RF, etc. As such, the device 700 could also be used as a microshutter which would impede electromagnetic waves impinging the device in an orthogonal direction with respect to the plane of the electrode 710. In this case, the moveable electrode 704 serves as the shutter.

A material which is transparent at RF, microwave or millimeter wave frequencies would preferably have the properties of being in the form of a thin sheet, and being of a high resistance, of the order of 10,000 ohms per square or higher. This kind of a sheet can be made from a variety of high resistance materials such as polysilicon, tantalum nitride, or even high resistance forms of ITO. Sheets of this type can be placed in or near the gap of switches used at RF, microwave or millimeter wave frequencies, and used as the actuation electrode to cause the moveable electrode to come into contact with the fixed electrode.

Electronic circuits in the microwave and millimeterwave frequency ranges are often realized using microwave integrated circuit (MIC) technology. MICs are planar structures that are made up of at least two conductors separated by a dielectric medium. Several types of MIC structures exist. They include microstrip, coplanar waveguide, stripline, etc.

In the case of microstrip circuits, a conductor path is separated from the ground plane conductor by a sheet of dielectric substrate material. The characteristic impedance the microstrip line presents to microwave or millimeterwave signals is determined by the ratio of the conductor trace width to the height above the ground plane (determined by the dielectric substrate thickness), and by the dielectric constant of the substrate material. Since the substrate thickness and dielectric properties are a constant, the characteristic impedance of the microstrip line is changed by varying the width of the conductor trace.

Accordingly, in an embodiment of the invention, the MEMS actuator devices are used as tuning elements by way of providing reconfigurable conductor metal in MIC circuits. An array of tuning elements fabricated on the substrate could be deployed in the pattern necessary to realize a microstrip line, for example, with a desired impedance. More complex circuits could also be realized by deploying the tuning elements in the necessary pattern. This technique would also work for other MIC technologies (coplanar waveguide, stripline, etc.).

In another embodiment an array of tuning elements is adjusted by actuating moveable electrodes using a control circuit to realize an optimal circuit configuration and then permanently affixed in that pattern by welding shut the contacts which are closed, or by otherwise changing the cantilever structure so the actuated electrodes will not move from the closed position. The tuning elements could then be detached from the array control circuitry and the array configuration would remain intact. The final circuit would then consist of only the MIC circuit (with the conductor path comprised of the permanently configured tuning element array) without the array control circuitry or the need for external bias voltages.

The basic concept behind the aforementioned application is to use the MEMS actuator devices or arrays of the devices as reconfigurable conductor metal in microwave circuits. It is realized that some changes in device design may be required to achieve the desired characteristics for microwave applications. For example, the device may have to be made with thicker metal layers to reduce losses. The modified devices can be deployed or retracted as desired to realize transmission lines, tuning elements, lumped or distributed circuit elements, or any other planar structure needed. An array of devices can be deployed to realize a certain circuit topology and then reconfigured as necessary to realize a circuit optimized for a different parameter (i.e. frequency, bandwidth, etc.). This technique is extremely beneficial in areas such as, but not limited to, wide bandwidth and multi-band communication systems, microwave transistor characterization systems (i.e. large-signal load-pull measurements, noise characterizations), microwave test instrument calibration, and microwave circuit design, verification, and prototyping.

One specific application is a scheme to provide adaptive tuning capabilities to microwave circuits. A common method of tuning prototype microwave circuits, or even fine tuning production circuits, is to selectively add or subtract tuning elements while monitoring the effect of such tuning using a network analyzer. In the case of a microstrip circuit, changing the size and shape of the microstrip line by the addition or subtraction of conductor metal will alter the impedance characteristics of that line. This makes it possible to tune the microstrip line to present an optimum circuit impedance. Modeled impedance matching networks are typically fabricated on the circuit along with "chicken dots" or "confetti" to which additional tuning elements could be attached as required.

In accordance with the invention, a technique is provided to tune microwave circuits using a version of the MEMS actuator device to act as tuning elements that significantly impacts microwave circuit design and implementation. Tuning elements which are configured remotely and "on demand" provide dynamic circuit tuning. It will be possible to take advantage of the RF conducting properties of the MEMS actuator devices and use them as MIC tuning elements.

Figure 9A:
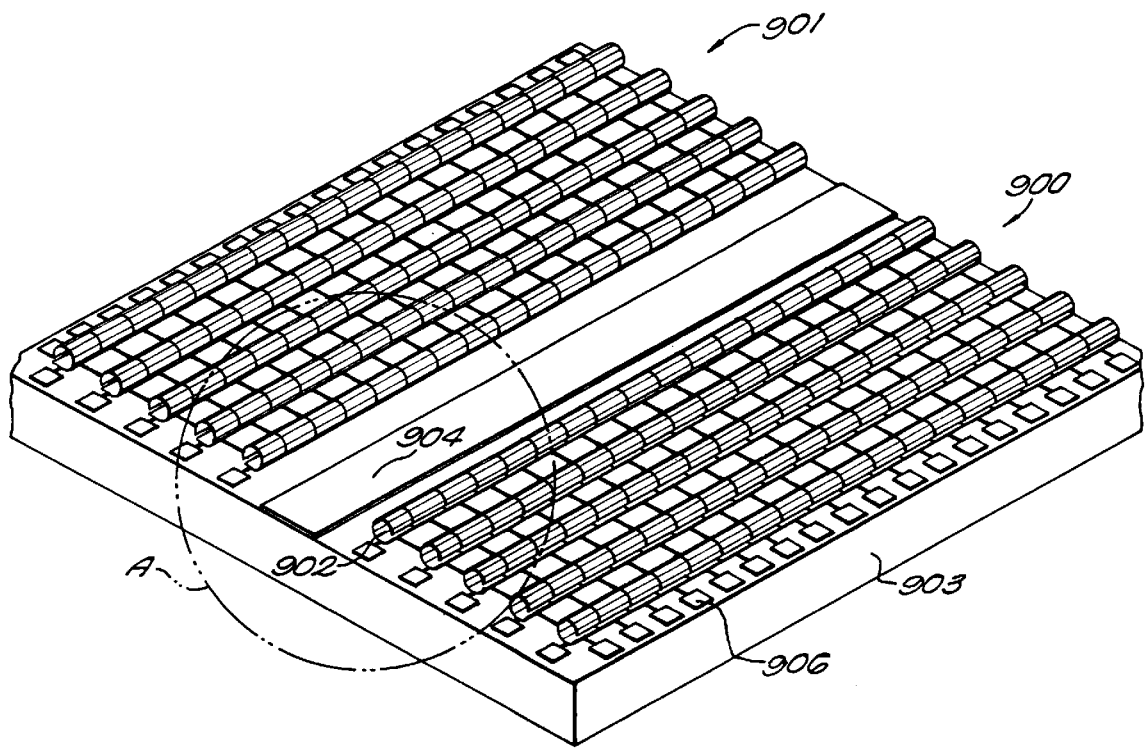
FIG. 9A is a perspective view of an exemplary configuration of a first and second array of MEMS actuator devices positioned on either side of a microstrip line.
Figure 9B:
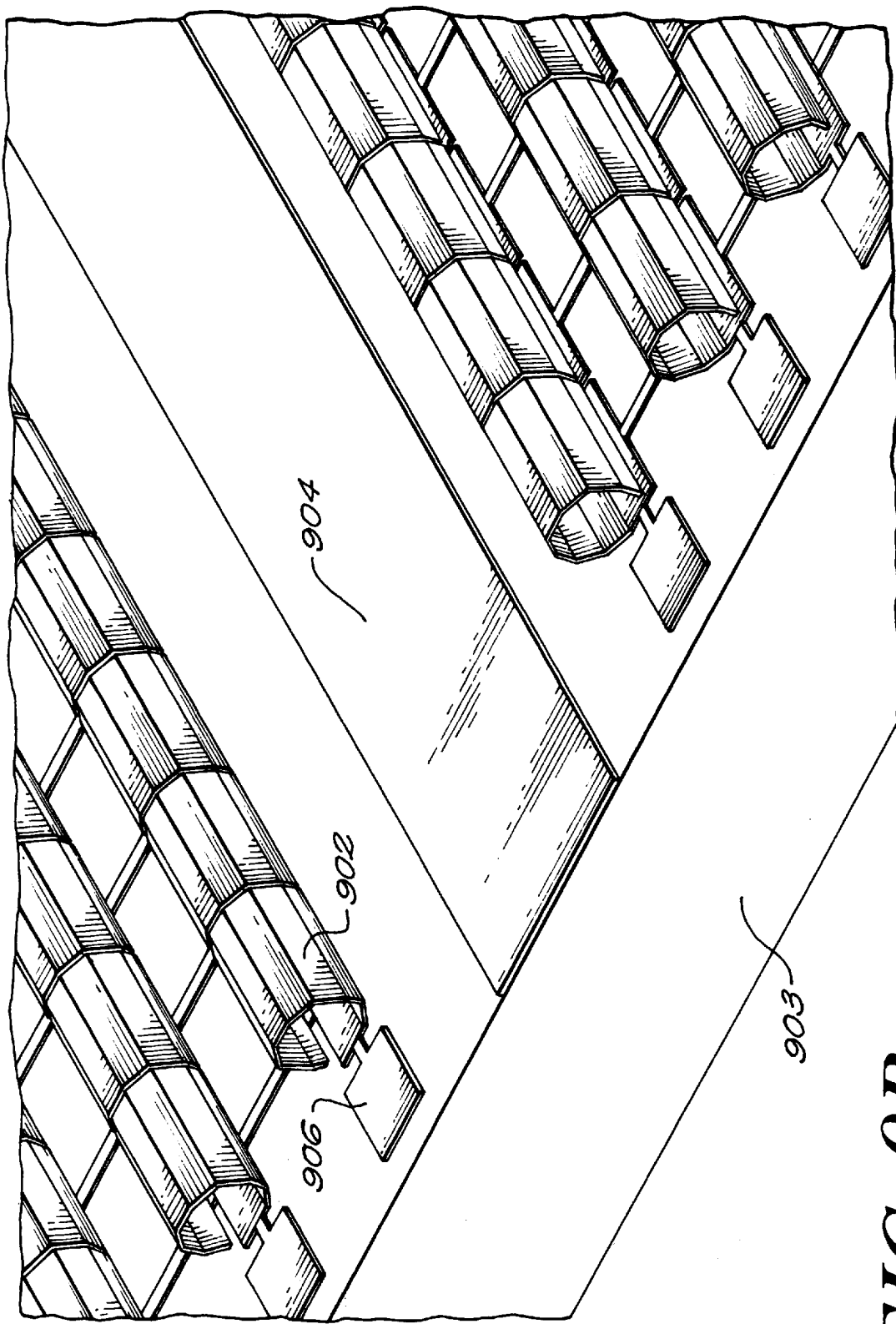
FIG. 9B is an enlarged view of the circled area designated "A" in FIG. 9A.

FIG. 9A is a perspective view of an exemplary configuration of first 900 and second 901 arrays of MEMS actuator devices 902 positioned on either side of a microstrip line 904 fabricated on a dielectric substrate 903. FIG. 9B is an enlarged view of the circled area designated "A" in FIG. 9A. The devices are then deployed or retracted as necessary to realize a wide range of impedance values. The devices in FIGS. 9A and 9B are in the retracted state. Also shown are contact pads 906 and associated bias lines which connect the individual tuning elements to a controller (i.e., a computer, ASIC, etc.). In this configuration, voltages supplied from the controller would apply the necessary bias to the array elements to deploy or retract them as desired.

Figure 9D:
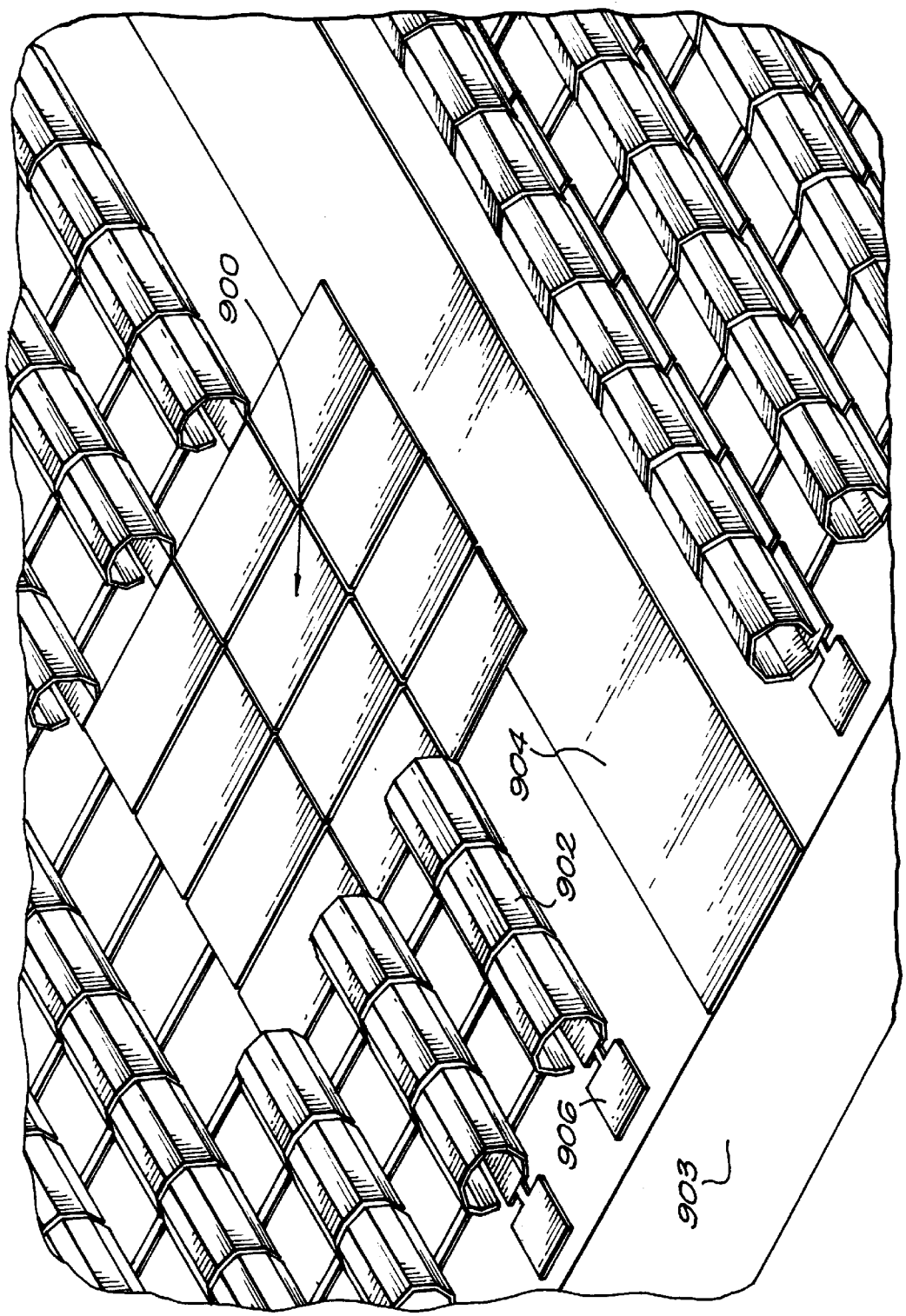
FIG. 9D is an enlarged view of the circled area designated "C" in FIG. 9C.

FIG. 9C is a perspective view of the configuration shown in FIG. 9A in which some of the tuning elements are deployed. FIG. 9D is an enlarged view of the circled area designated "C" in FIG. 9C. The tuning elements are deployed in a pattern to realize two open circuited stubs 910 and 912. The devices 902 can be arranged in many configurations and can be used to modify circuit characteristics in many ways.

Figure 10A:
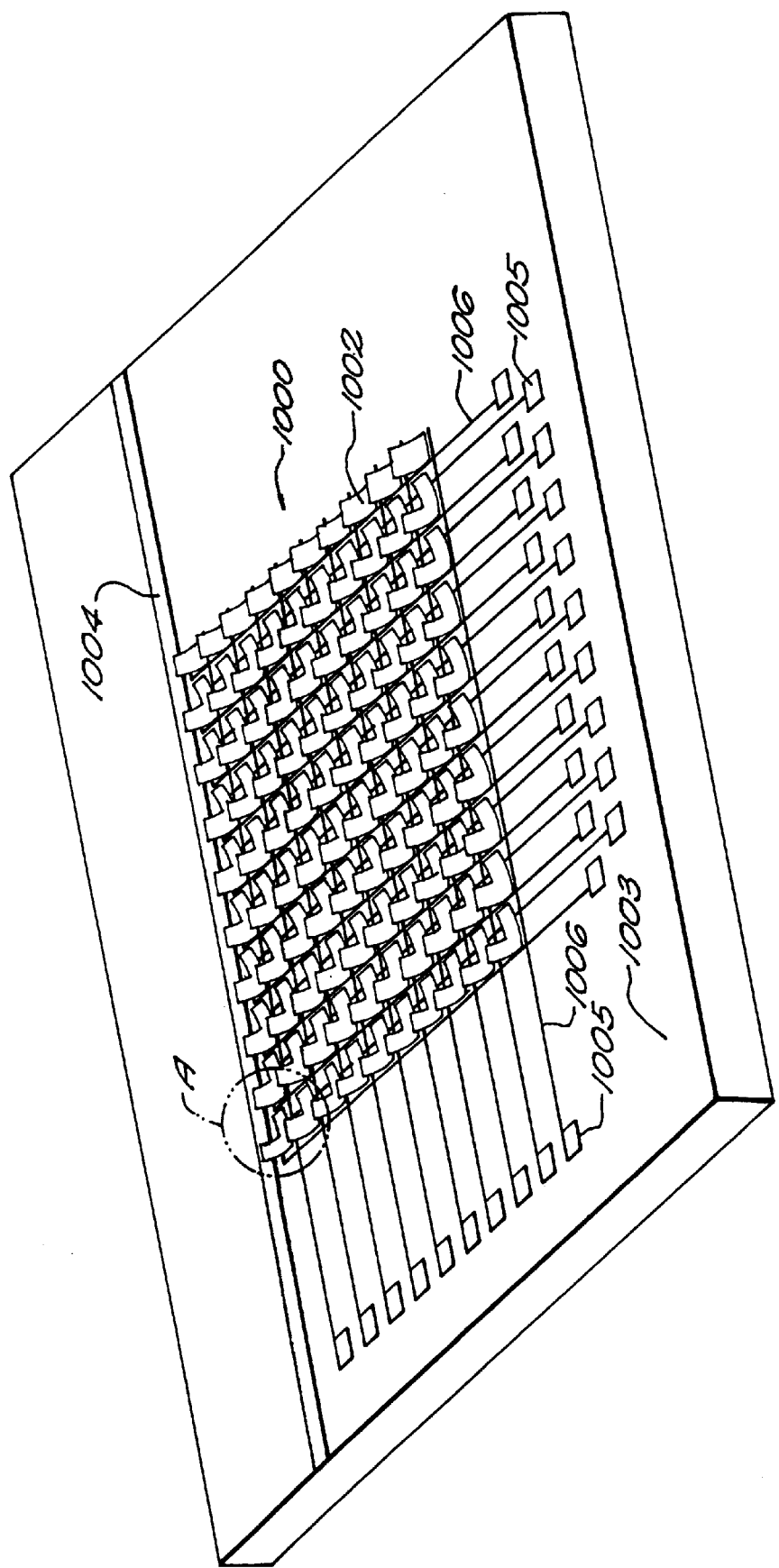
FIG. 10A is a perspective view of an alternative embodiment of an array of MEMS actuator devices serving as tuning elements in accordance with the invention.
Figure 10B:
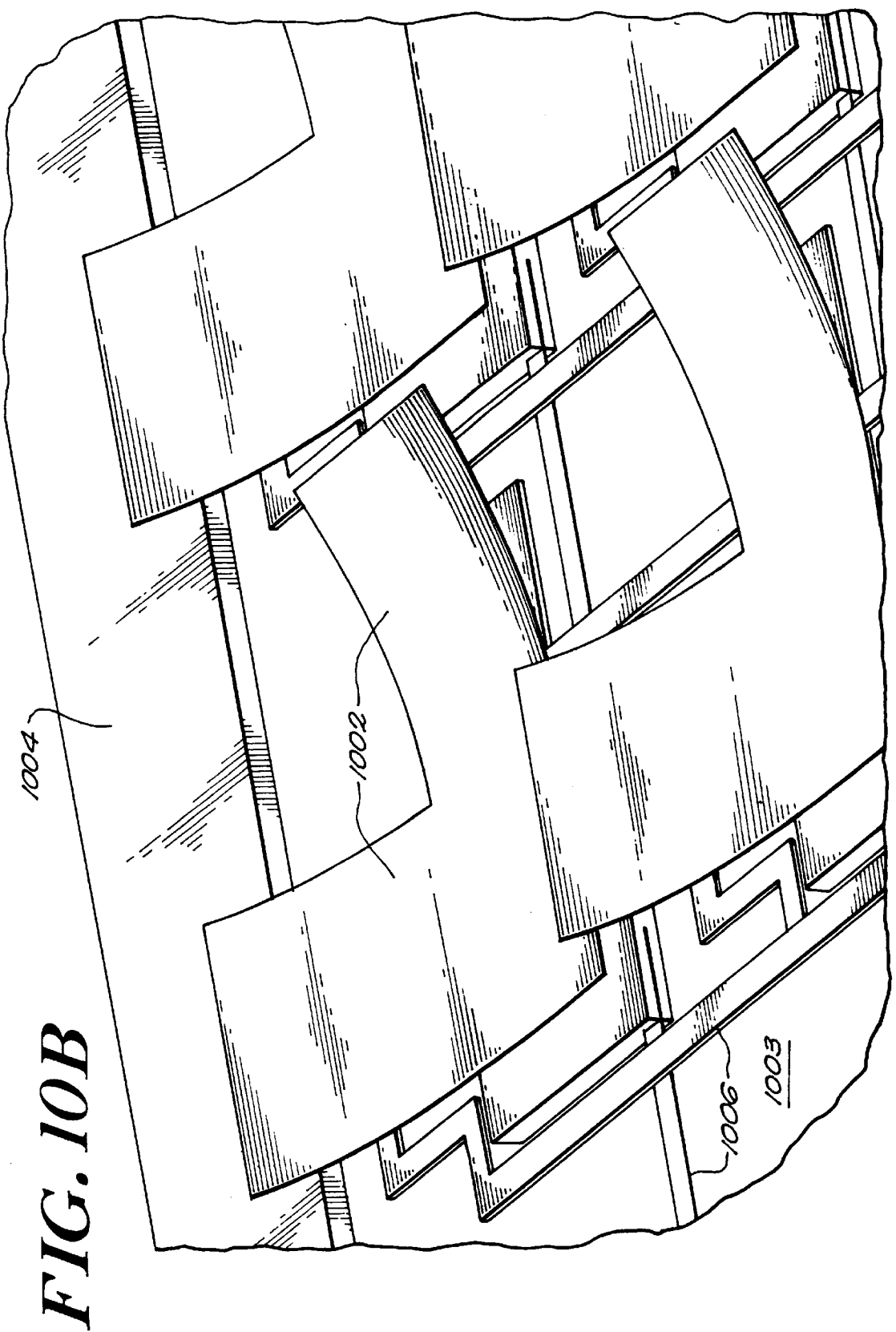
FIG. 10B is an enlarged view of the circled area designated "A" in FIG. 10A.

FIG. 10A is a perspective view of an alternative embodiment of an array 1000 of MEMS actuator devices 1002 serving as tuning elements in accordance with the invention. FIG. 10B is an enlarged view of the circled area designated "A" in FIG. 10A. In this configuration, the tuning elements are fabricated as pairs of devices 1002 that are oriented perpendicularly to each another. The arrangement allows the tuning element to contact adjacent elements in either the X or Y direction, permitting greater flexibility in the manner in which the array is deployed. As in FIG. 9A, the array 1000 of tuning elements is positioned on either side of a microstrip line 1004 fabricated on a dielectric substrate 1003. The devices can then be deployed in any pattern to realize the desired circuit performance. Also shown are contact pads 1005 and associated bias lines 1006 which connect the individual tuning elements to a controller.

Circuits operating at RF frequencies (below 1–2 GHz) usually use lumped components, while circuits operating at microwave frequencies (above 1–2 GHz) tend to use distributed components. Both types of circuits can be tuned using MEMS actuator devices in accordance with the invention. However, the implementations can vary. Descriptions of exemplary MEMS actuator device tuning implementations for both lumped and distributed circuits are provided hereinafter.

The MEMS actuator devices of the invention, utilized as RF switches, can easily be applied to design variable lumped inductors and capacitors. FIG. 11 is a perspective view of a reconfigurable variable spiral inductor 1100 in accordance with the invention. An array 1102 of MEMS devices 1104 is fabricated along with input 1106 and output 1108 conductors on a substrate 1110. An airbridge 1112 is fabricated from the end of the output conductor 1108 to a point in the center of the device array 1102 to provide a cross over current path. The input conductor 1106 makes contact at one edge of the array. Selected devices 1114 are deployed in a manner as to form a conducting path in a spiral pattern from the input conductor to the airbridge in the center of the array. The width of the conducting path, the number of loops around the center, and the spacing between the loops determines the inductance of the circuit.

Figure 12:
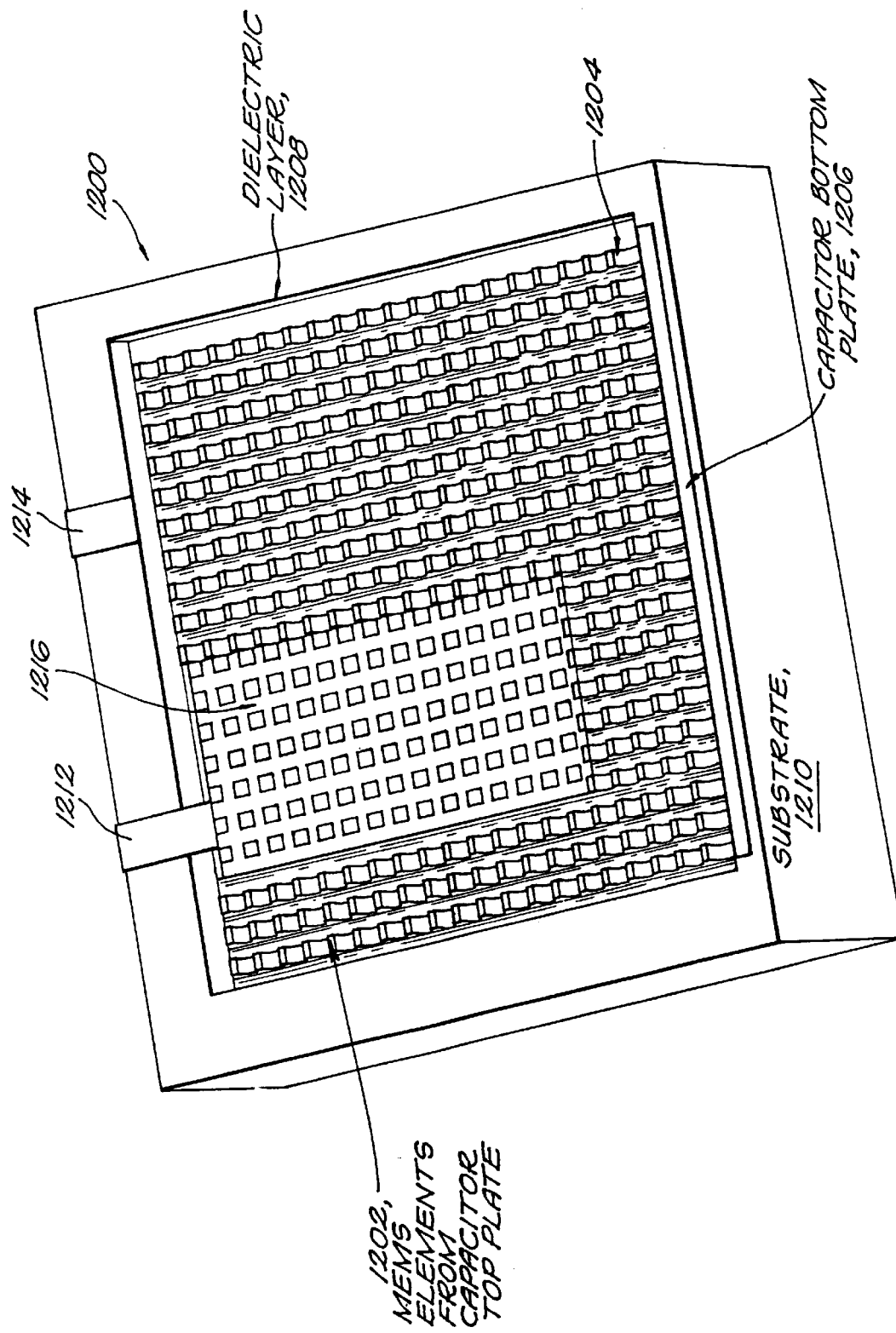
FIG. 12 is a perspective view of a reconfigurable variable capacitor in accordance with the invention.

Variable capacitors can be made by fabricating several smaller capacitors and using the MEMS devices to adjust the amount of plate area (by connecting the desired number of smaller capacitors in parallel) to set the capacitance. FIG. 12 is a perspective view of a reconfigurable variable capacitor 1200 in accordance with the invention. An array 1202 of MEMS devices 1204 is fabricated on a substrate 1210 such that the array 1202 is separated from a conductor plate 1206 by a layer 1208 of dielectric material. An input conductor trace 1212 contacts the array 1202 and an output conductor trace 1214 contacts the conductor plate 1206. Selected deployed devices 1216 in the array on the top and the conductor plate on the bottom form a capacitor. The number of devices deployed changes the size of the top plate of the capacitor, which determines the value of the capacitor.

Figure 13A:
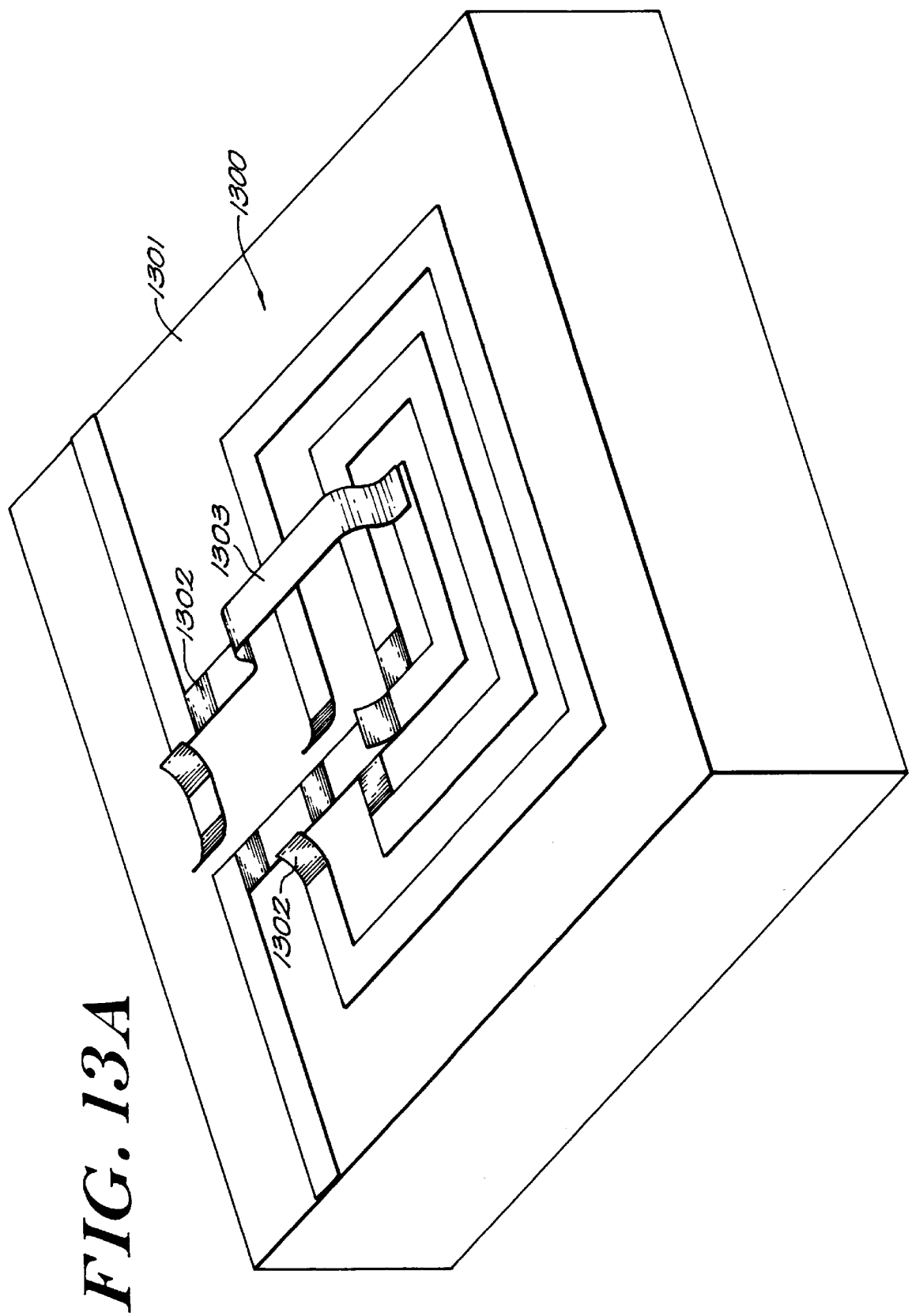
FIG. 13A is a perspective view of an alternative embodiment of a variable lumped spiral inductor.

FIG. 13A is a perspective view of an alternative embodiment of a variable lumped spiral inductor 1300. Another way to realize a variable inductor is to short-circuit the appropriate number of turns in a spiral using the MEMS devices of the invention. The spiral inductor 1300 is fabricated on a dielectric substrate 1301 with several MEMS devices 1302 positioned in a manner that allows them to short-circuit turns in the spiral depending on whether they are deployed or retracted. The value of inductance is varied by changing the number of turns that comprise the inductor between its input and an air bridge 1303 to the output.

Figure 13B:
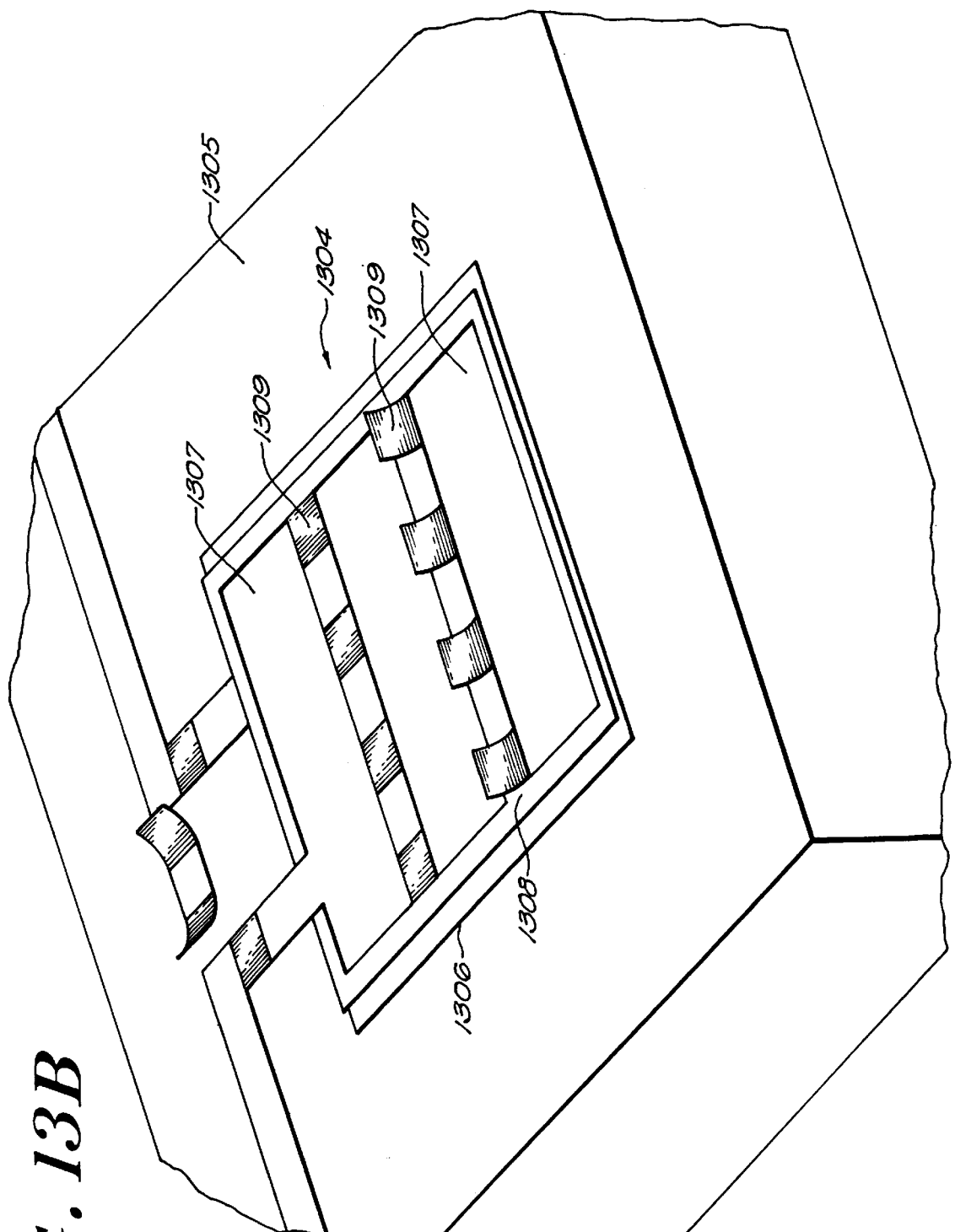
FIG. 13B is a perspective view of an alternative embodiment of a variable lumped capacitor.

FIG. 13B is a perspective view of an alternative embodiment of a variable lumped capacitor 1304. The capacitor 1304 is fabricated on a dielectric substrate 1305. In the illustrated embodiment, a conductor plate 1306, which defines one plate of the capacitor, is separated from several conductor plates 1307, which define the other plate of the capacitor, by a dielectric layer 1308. A plurality of MEMS devices 1309 are positioned to effectively change the size of the top conductor plate depending on the state of the devices, i.e., deployed or retracted. The devices 1309 separate the conductor plates that define the top plate of the capacitor. By deploying the devices between two sections of the top plate, the plate is made larger and increases the capacitance. Conversely, when the devices are retracted, the plates are isolated from each other, the area of the top plate is decreased and the capacitance is also decreased.

FIG. 14A is a schematic circuit diagram of a tunable bandpass filter 140 using variable inductors and capacitors. The center frequency and bandwidth of this filter can be adjusted by tuning the values of the inductors and capacitors in the tank circuits.

FIG. 14B is a plan view of a schematic diagram of an exemplary tunable band-pass filter 1400 which utilizes MEMS devices to tune element values. The filter includes spiral inductors 1402 having MEMS devices 1404 to shorten or lengthen the turns in the inductor, and parallel plate capacitors 1406 having MEMS devices 1408 to add or subtract area for varying the capacitance.

It is important to note that the reconfigurable lumped circuit elements require only a few MEMS devices if not constructed from an array. This is different from the reconfigurable distributed circuit element arrays discussed hereinafter which will require a moderately large array of MEMS devices. This example is just one of many possibilities for reconfigurable lumped circuits. In terms of filters, tunable low pass, band pass, high pass and notch filters can also be designed using the MEMS devices of the invention. Tunable impedance matching networks for amplifiers and antennas can be used to optimize the performance over a wide frequency band. In addition, the concept of short circuiting the inductor spirals can be applied to form a variable turn-ratio transformer.

Metal patterning on a planar microstrip is a popular implementation method for microwave circuitry which uses distributed element design. Distributed filter topologies are available which cover a wide variety of filter bandwidths and center frequencies. Any of these circuits would be good candidates for a MEMS device planar array implementation. Implementation as a MEMS device array would allow filter topologies to be tuned or even shifted to a completely different type of filter as required by the hardware (e.g., to switch from one receive band to another in a wideband receiver). The reconfiguration of filter topology would be accomplished by changing the pattern of "on" and "off" switches in the array. The "on" (lowered) devices would correspond to the metallized portions of a microstrip circuit. The "off" (raised) devices would correspond to non-metallized or blank portions of the circuit topology. Individual filters can also be combined into more complicated structures, such as diplexers. Other circuit elements, such as tunable matching circuits, resonators, or even lumped components (inductors or capacitors) can be constructed by appropriately programming the MEMS device array pattern.

A MEMS device array in accordance with the invention differs from a standard microstrip circuit in several important ways. The array of devices and spacing between the devices means that circuit metal in the areas where devices are actuated will be in a gridlike or checkerboard pattern rather than continuous metal. Blank areas of the circuit pattern implemented by raised or "off" devices are not completely blank and will still contain the metal bases and levers associated with the non-actuated devices. Also, in exemplary configurations, there is provided an underlying control grid and a thin insulating layer between the device metal and the substrate. With proper design and frequency scaling of the MEMS devices, the effect of most of these MEMS device array items on the actual RF performance of the circuit can be made acceptably small.

Figure 15A:
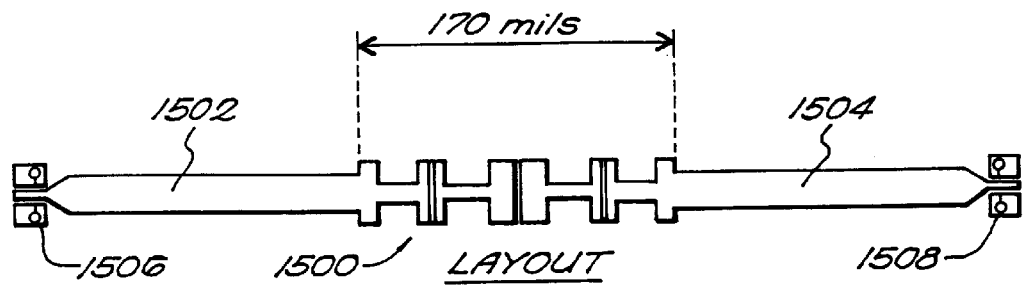
FIG. 15A is a top plan view of the metal layout for a standard (continuous metal) microstrip version of a distributed 40 GHz bandpass filter.

FIG. 15A is a top plan view of the metal layout for a standard (continuous metal) microstrip version of a distributed 40 GHZ bandpass filter 1500. The filter itself occupies about 170 mils length at the center of the layout. The remainder of the layout consists of reference transmission lines 1502,1504 and probing points 1506,1508 used to make measurements and are not functionally part of the filter itself.

Figure 15C:
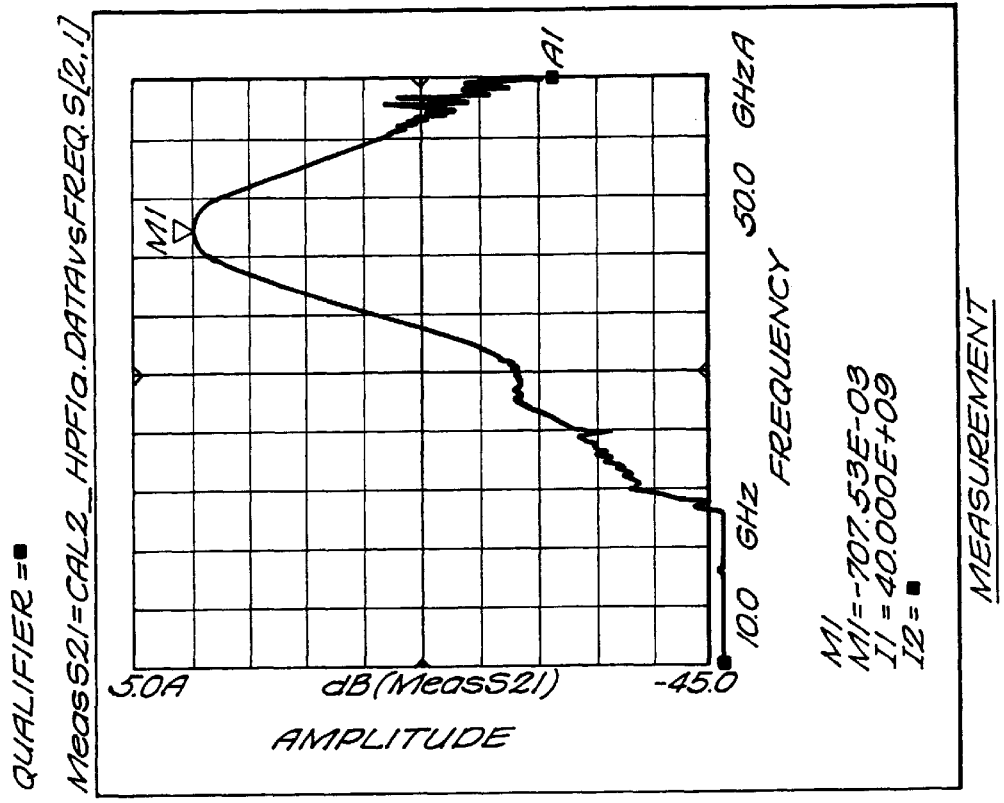
FIGS. 15B and 15C are graphs which plot the passband results for an EM simulation used to design the filter, and for a measurement made of a breadboard fabricated in accordance with this design, respectively.
Figure 15B:
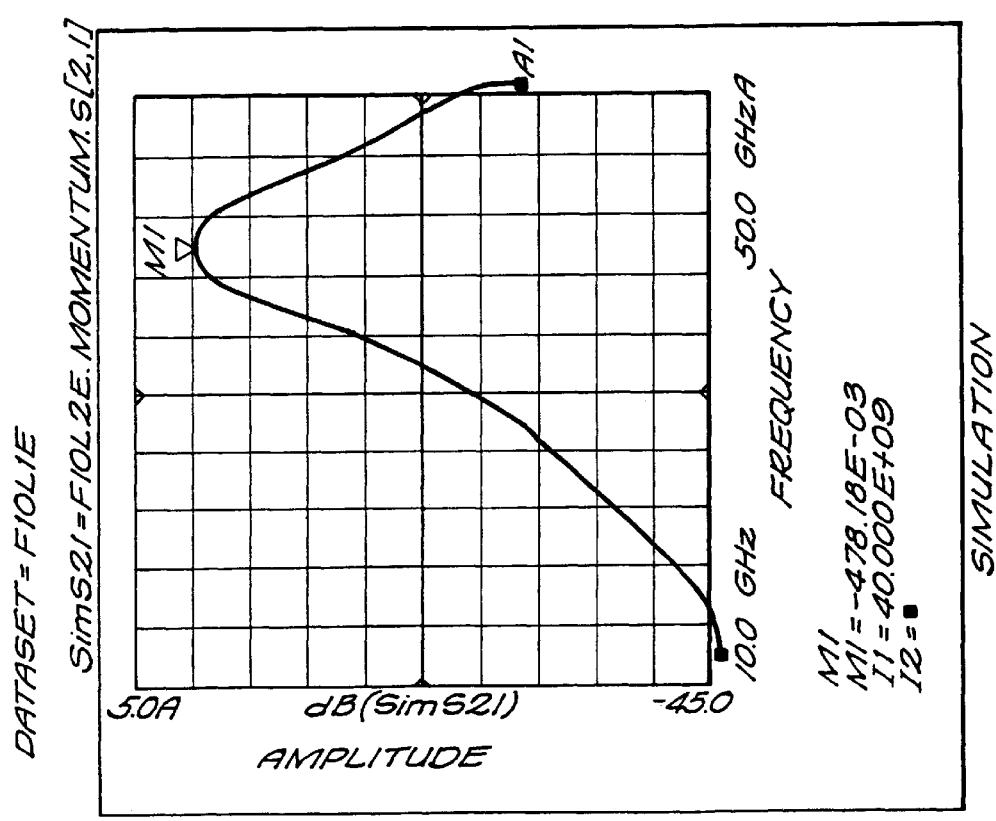

FIGS. 15B and 15C are graphs which plot the passband results for an EM simulation used to design the filter 1500, and for a measurement made of a breadboard fabricated in accordance with this design, respectively. The design and measured passbands correspond quite well.

Figure 16A:
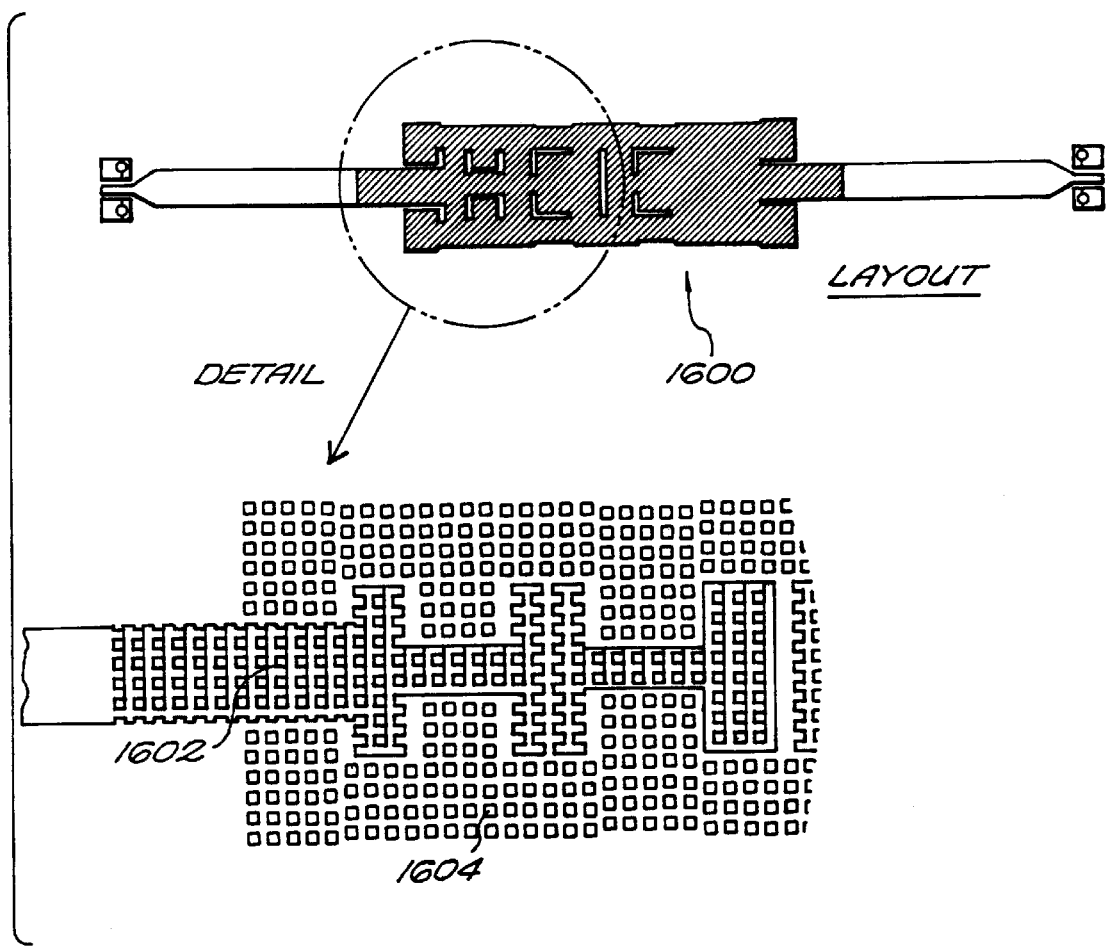
FIG. 16A is a top plan view of the metal layout for a standard microstrip version of a distributed 40 GHz bandpass filter implemented with a "checkerboard" metal pattern which approximates the metal configuration that would be present in a MEMS device array implementation.

FIG. 16A is a top plan view of the metal layout for a standard microstrip version of a distributed 40 GHz bandpass filter 1600 implemented with a "checkerboard" metal pattern which approximates the metal configuration that would be present in a MEMS device array implementation, including actuated devices 1602 and nearby disconnected metal pads to represent non-actuated devices 1604. In this example, metal pads 2 mils square with 4 mil center spacing is assumed.

Figure 16C:
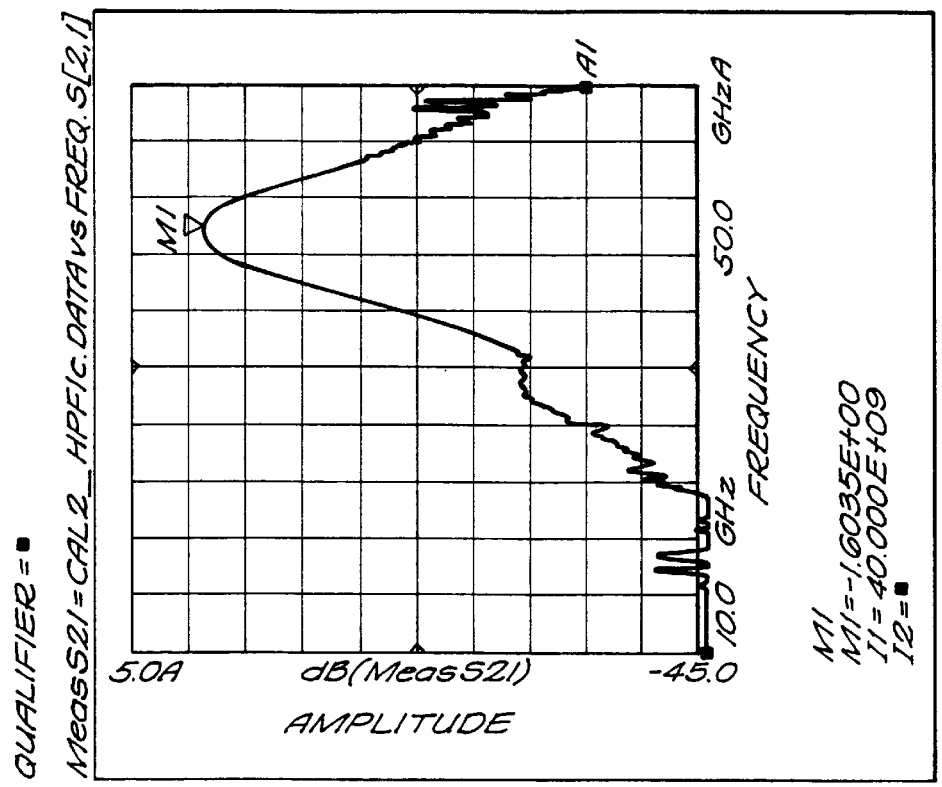
FIGS. 16B and 16C are graphs which plot the results from the design EM simulation and a direct measurement of filter, respectively.
Figure 16B:
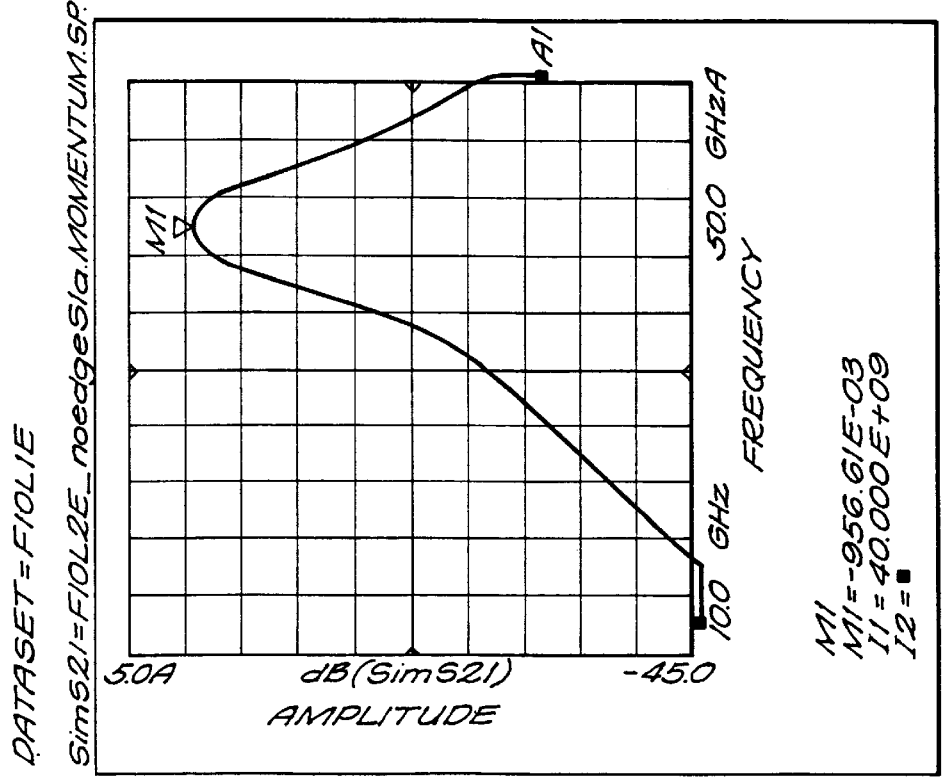

FIGS. 16B and 16C are graphs which plot the results from the design EM simulation and a direct measurement of filter 1600, respectively. These passbands are also very similar to those shown in FIGS. 15B and 15C for filter 1500, indicating that the checkerboard metal pattern imposed by the MEMS device array of the invention has minimal effect on electrical performance of this design.

Figure 17A:
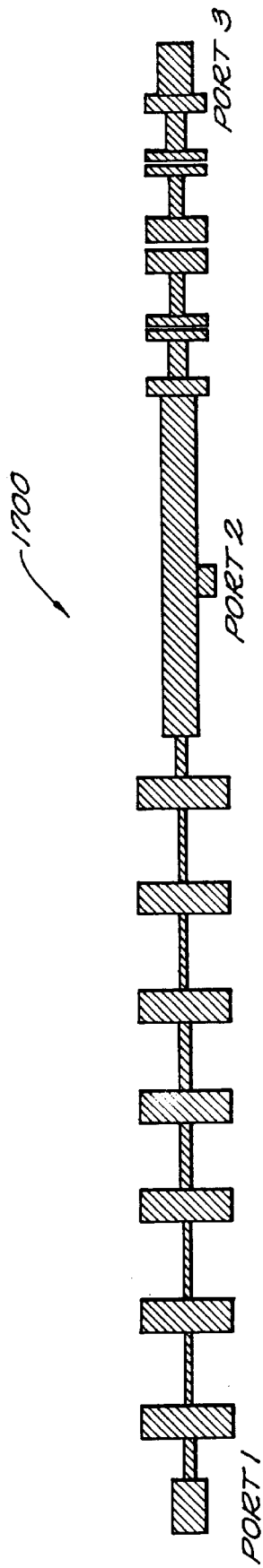
FIG. 17A is a top plan view of the metal layout of a MEMS-capable 20/40 GHZ diplexer which incorporates the filters of FIGS. 15A and 16A.

These filters can be combined to create more complex circuits. FIG. 17A is a top plan view of the metal layout of a 20/40 GHz diplexer 1700 which incorporates the filters of FIGS. 15A and 16A. The diplexer 1700 has three ports, Port 1, Port 2 and Port 3. The diplexer separates two frequency bands at Port 2 into a higher (40 GHz) band at Port 3, and a lower (20 GHz) band at Port 1. Alternatively, the diplexer can be used to separate a transmitter in one of these bands from a receiver in the other band, with about 40 dB isolation.

Figure 17B:
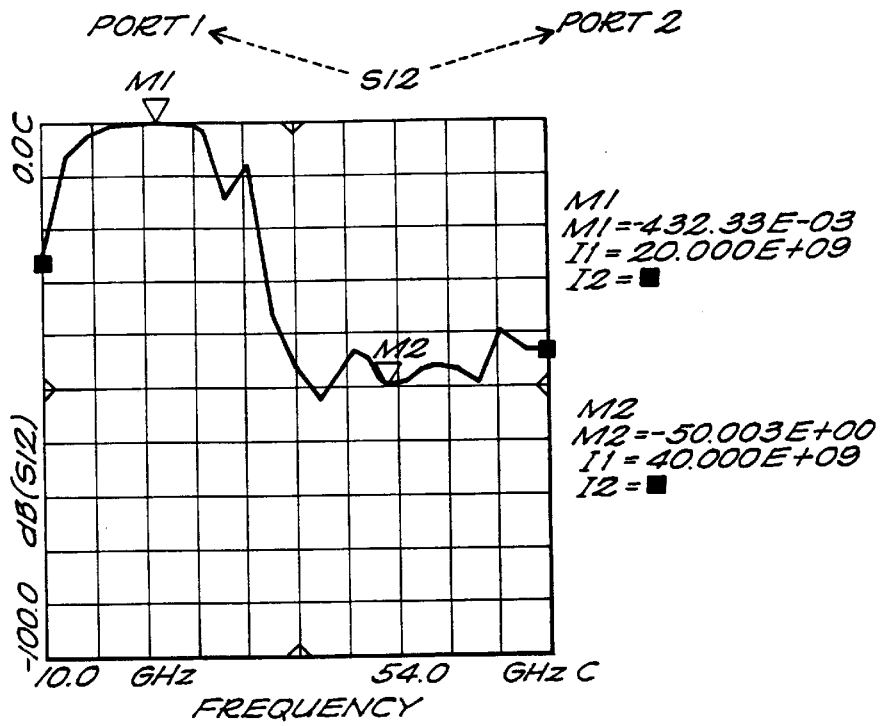
FIGS. 17B, 17C and 17D are graphs which plot the three passbands corresponding to the bands coupled and isolated for the given pairs of ports of the diplexer in FIG. 17A.
Figure 17C:
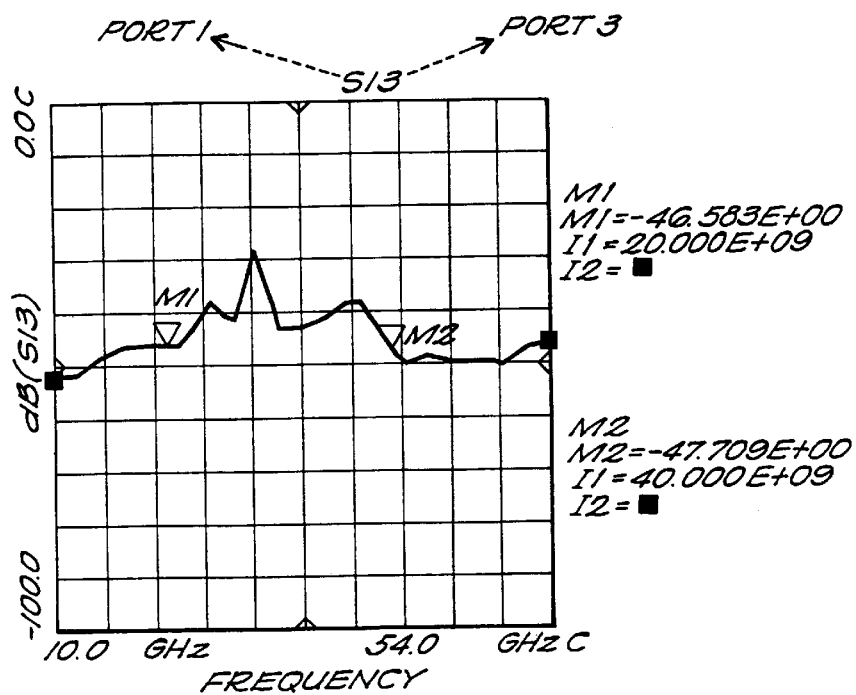
Figure 17D:
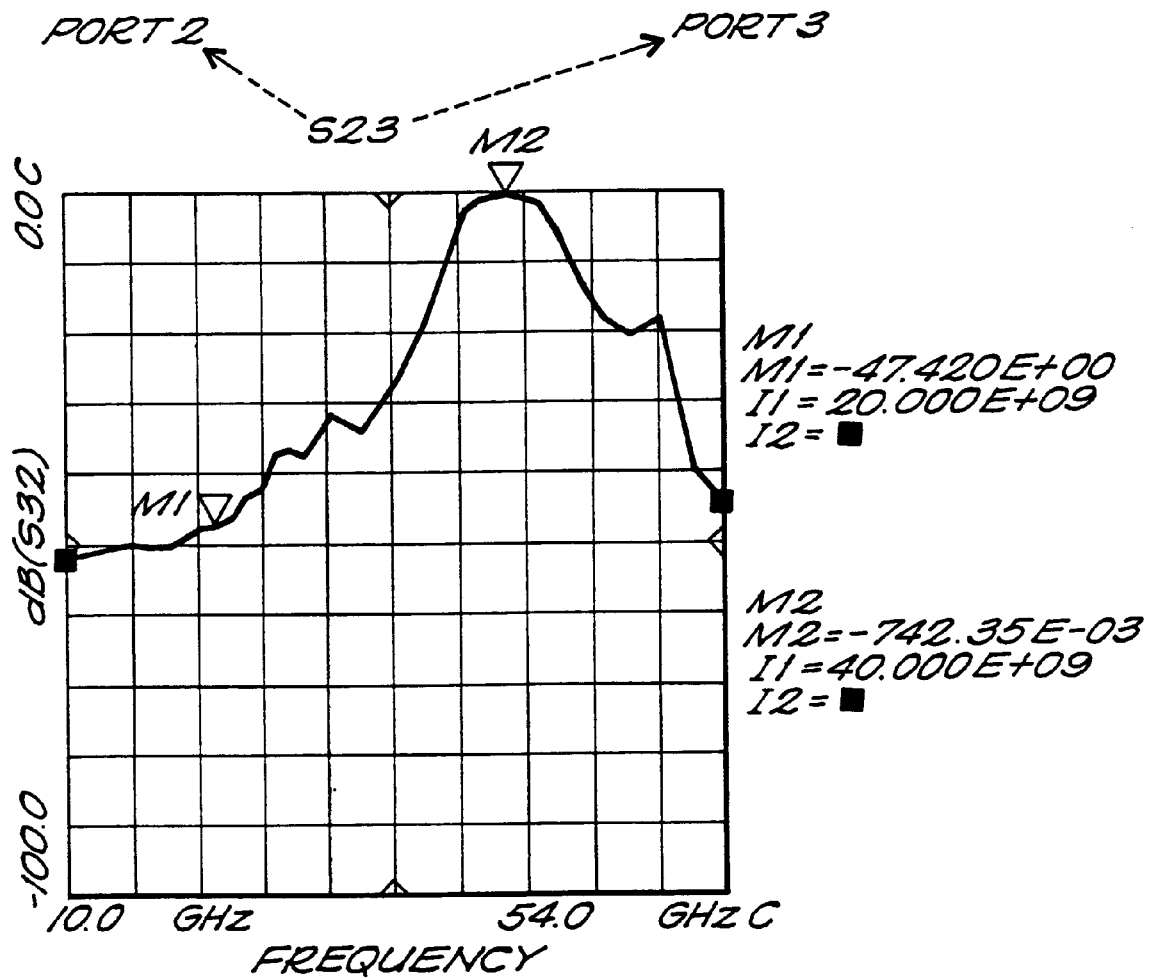

FIGS. 17B–17D are graphs which plot the three passbands corresponding to the bands coupled and isolated for the given pairs of ports, Ports 1 and 2, Ports 1 and 3, and Ports 2 and 3, respectively. In a MEMS device implementation of a circuit like this in accordance with the invention, relative frequency positioning of the transmit and receive bands can be changed as needed by reprogramming the MEMS devices to change the filter topologies.

Reconfigurable circuits utilizing the MEMS devices or arrays of the MEMS devices of the invention can find uses in any microwave circuit where the ability to modify the circuit instantaneously would be advantageous. For example, re-tuning amplifiers or filters to operate at different frequencies or to compensate for changes in operating conditions such as temperature. Ultra-wide band amplifiers can be built which would perform with higher gain, output power, and efficiency by configuring the MEMS devices to optimize narrow band performance at the desired instantaneous frequency and reconfiguring the system to perform at other frequencies as the need arises. Without having to make trade-offs to achieve instantaneous wide bandwidths, amplifier performance can be greatly enhanced.

Figure 18:
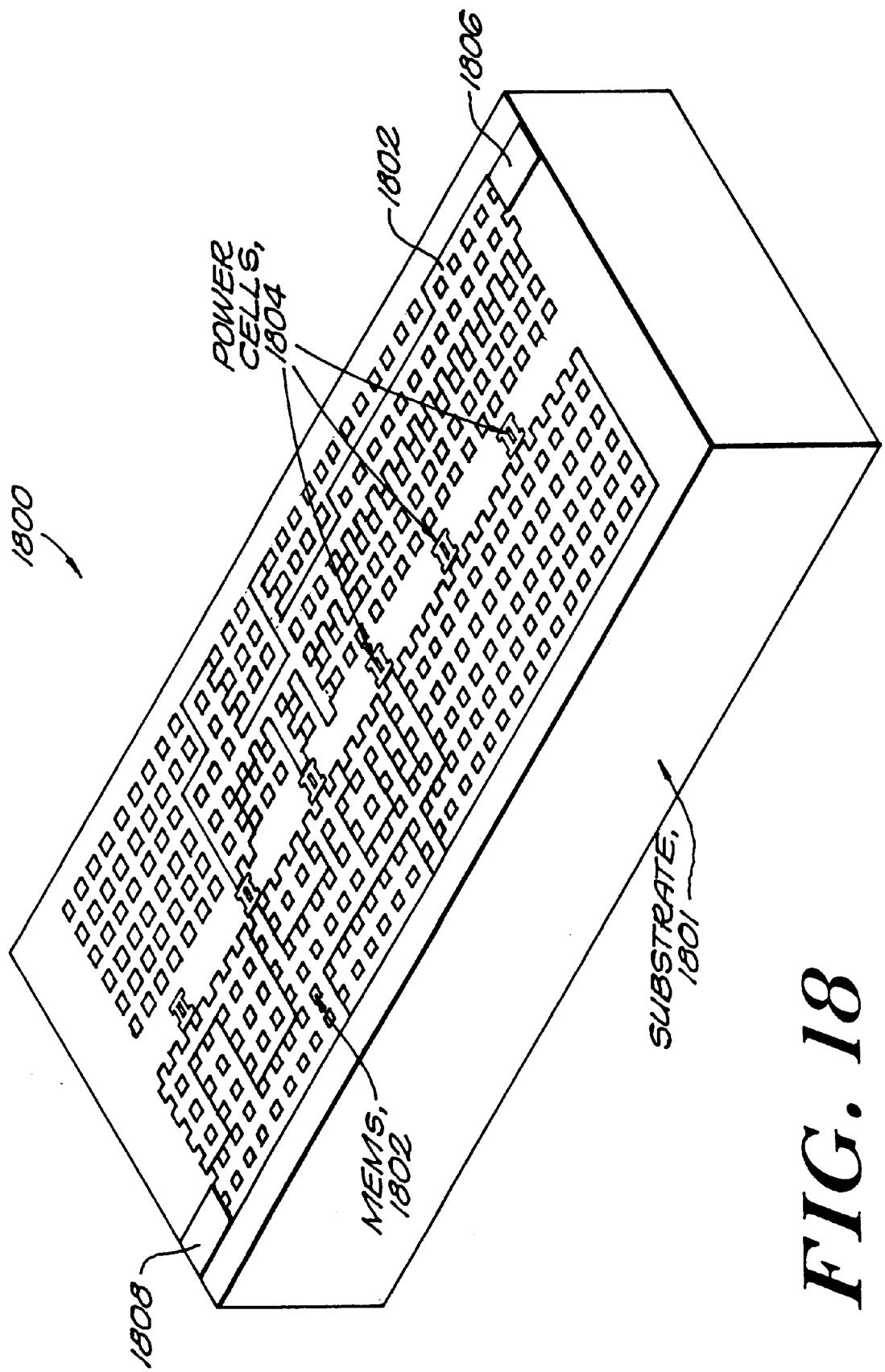
FIG. 18 is a perspective view of a reconfigurable variable output power amplifier in accordance with the invention.

FIG. 18 is a perspective view of a reconfigurable variable output power amplifier 1800 in accordance with the invention. The amplifier includes a substrate 1801 on top of which is provided an array of MEMS actuator devices 1802, power cell transistors 1804, an input node 1806 and an output node 1808. By selectively actuating certain of the MEMS devices, a string of the power cells can be added to a circuit between the input and output. This operation would provide not only tuning of the amplifiers, but would also be useful to switch the power transistors in and out of the circuit as necessary to control the output power level of the amplifier 1800. The MEMS devices also provide the adaptability necessary to retune the circuit as required when overall transistor size is modified by the addition or subtraction of a transistor and device input and load impedance requirements change.

FIG. 19 is a schematic diagram of a variable L-C match RF amplifier circuit 1900. In the circuit, values of lumped inductors 1901 and lumped capacitors 1902 are varied by switching tuning actuators in and out as is described with reference to FIG. 14. These variable reactances are used to tune transistors 1903 to optimize performance of the amplifier circuit. Also included in the circuit are switches 1904 at the input and output of the individual amplifier branches. These switches provide step increments in overall amplifier power output by changing the number of transistors that are included in the circuit.

Personal communications systems can take advantage of reconfigurable circuits using the MEMS devices of the invention by building transmitters and receivers which can be re-tuned to be compatible with multiple platforms. A personal phone can be configured to transmit and receive at the appropriate frequencies for multiple terrestrial or satellite based systems, such as dual mode PCS/cellular.

Vector network analyzer calibration can also make use of this technology. A tuning array can be configured to present the network analyzer with various known impedances. Measurement errors in the network analyzer can then be mathematically removed having made only one physical connection to a calibration standard, thereby improving calibration accuracy and speed, and reducing connector wear.

Optimal large-signal terminating impedances for power microwave transistors can be determined using the MEMS devices of the invention. Tuning arrays at the input and output connections of a transistor can be varied until the terminating impedances which yield the optimum performance (gain, output power, or efficiency) are determined. A similar technique can be used to determine the best terminating impedances for noise performance of microwave devices.

FIG. 20 is a perspective view of a MEMS binary switched circuit 2000 in accordance with the invention. This configuration provides a means to switch between large areas of patterned metal used as microwave circuits. Entire microwave circuits are fabricated on large actuators and switched in to the overall circuit as desired. A large MEMS device can be built utilizing only the layers necessary for switch actuation. Two such devices would be placed one on either side of a transmission line, circuits 2002 and 2004. Circuits for distinct functions would be fabricated on each of the structures. As one circuit function is desired the appropriate MEMS actuator device 2006 is deployed and the circuit is switched into position contacting the transmission line. The device with the undesired circuit is retracted and removed from the transmission line. As circuit needs change, the devices are switched in and out as required.

What is claimed is:

1. A microelectro-mechanical device comprising:
   a fixed electrode formed on a substrate, said fixed electrode including an electrically conducting transparent, high resistance layer;
   a moveable electrode disposed adjacent said fixed electrode;
   first and second electrically conductive regions which are isolated from one another by said fixed electrode, said moveable electrode being electrically coupled to said first conductive region.

2. The device of claim 1, wherein said fixed and moveable electrodes are configured within an array of similar devices.

3. The device of claim 2, wherein each device or groups of devices in said array are individually addressable to actuate said moveable electrodes.

4. The device of claim 1, wherein said moveable electrode moves to cover said fixed electrode and to electrically couple to said second conductive region, thus electrically coupling said first and second conductive regions, in response to a potential being applied across said fixed and moveable electrodes.

5. The device of claim 4, wherein said potential is applied directly to said fixed electrode and capacitively to said moveable electrode via a second fixed electrode.

6. The device of claim 5, wherein said second fixed electrode comprises a transparent, high resistance layer.

7. The device of claim 4, wherein the electrical coupling between said moveable electrode and said second conductive region comprises a low resistance contact.

8. The device of claim 3, wherein said fixed electrode is transparent to electromagnetic signals or waves.

9. The device of claim 8, wherein said moveable electrode impedes transmission of electromagnetic signals or waves.

10. The device of claim 4, wherein said potential is applied directly to said fixed and moveable electrodes.

11. A reconfigurable circuit comprising:
    an array of actuatable devices which are addressed individually or in selected groups, each of said actuatable devices including:
       a fixed electrode formed on a substrate, said fixed electrode including a transparent, high resistance layer; and
       a moveable electrode formed with an anisotropic stress in a predetermined direction and disposed adjacent said fixed electrode.

12. The circuit of claim 11, wherein said circuit comprises a variable output power amplifier.

13. The circuit of claim 11, wherein each of said actuatable devices comprises a first and second electrically conductive regions which are isolated from one another by said fixed electrode, said moveable electrode being electrically coupled to said first conductive region.

14. The circuit of claim 13, wherein said moveable electrode moves to cover said fixed electrode and to electrically couple to said second conductive region, thus electrically coupling said first and second conductive regions, in response to a potential being applied across said fixed and moveable electrodes.

15. The circuit of claim 14, wherein said fixed electrode is transparent to electromagnetic signals or waves.

16. The circuit of claim 15, wherein said moveable electrode impedes transmission of electromagnetic signals or waves.

17. The circuit of claim 11, wherein said circuit comprises a tunable RF filter.

18. The circuit of claim 11, wherein said circuit comprises a microwave tuning element.

19. The circuit of claim 11, wherein said circuit comprises a variable resistor.

20. The circuit of claim 11, wherein said circuit comprises a variable capacitor.

21. The circuit of claim 11, wherein said circuit comprises a variable spiral inductor.

22. The circuit of claim 11, wherein said circuit comprises a MMIC with variable interconnects.

23. The circuit of claim 11, wherein said circuit comprises a binary switched circuit.

* * * * *